(12) United States Patent
Huber

(10) Patent No.: US 6,741,121 B2
(45) Date of Patent: May 25, 2004

(54) DIFFERENTIAL AMPLIFIER COMMON MODE NOISE COMPENSATION

(75) Inventor: Brian W. Huber, Allen, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/228,704

(22) Filed: Aug. 27, 2002

(65) Prior Publication Data

US 2004/0041625 A1 Mar. 4, 2004

(51) Int. Cl.[7] .................................................. G06G 7/12
(52) U.S. Cl. ........................ 327/563; 327/551; 330/258
(58) Field of Search ........................... 327/560, 562, 327/563, 551, 378–384, 335, 359, 361, 52; 326/22–26; 330/277, 251–261

(56) References Cited

U.S. PATENT DOCUMENTS

| | | | |
|---|---|---|---|
| 3,641,450 A | 2/1972 | Lunn | 330/30 D |
| 4,517,525 A * | 5/1985 | Dijkmans et al. | 330/260 |
| 4,769,616 A * | 9/1988 | Barbu | 330/252 |
| 4,977,378 A | 12/1990 | Tero | 330/258 |
| 5,361,040 A | 11/1994 | Barrett, Jr. | 330/253 |
| 5,619,169 A | 4/1997 | Matsuura | 330/254 |
| 5,783,953 A | 7/1998 | Bosnyak et al. | 327/101 |
| 5,793,551 A * | 8/1998 | Ngo et al. | 360/67 |
| 6,028,466 A | 2/2000 | Hartley | 327/328 |
| 6,064,613 A | 5/2000 | Wang | 365/207 |
| 6,377,120 B1 | 4/2002 | Hsieh | 330/253 |
| 6,456,144 B2 * | 9/2002 | Catala | 327/359 |
| 6,472,908 B1 * | 10/2002 | Smetana | 327/52 |
| 6,504,435 B1 | 1/2003 | Martins | 330/292 |

OTHER PUBLICATIONS

Allen, P., et al., *CMOS Analog Circuit Design, 2nd Edition*, (2002), pp. 390–393.

* cited by examiner

*Primary Examiner*—Minh Nguyen
(74) *Attorney, Agent, or Firm*—Schwegman, Lundberg, Woessner & Kluth, P.A.

(57) ABSTRACT

An amplifying circuit includes a compensation unit with a feeding forward path to reduce the effect of the common mode noise on the output signals of a differential amplifier. The compensation unit includes a capacitive network connected to input nodes and output nodes of the differential amplifier. The capacitive network provides the feeding forward path.

47 Claims, 20 Drawing Sheets

US 6,741,121 B2

DIFFERENTIAL AMPLIFIER COMMON MODE NOISE COMPENSATION

TECHNICAL FIELD

The present invention relates generally to electronic circuits, and in particular to common mode noise in differential amplifiers.

BACKGROUND

Differential amplifiers are widely used in electrical circuits to amplify a difference in voltages between two input signals to produce amplified differential output signals.

FIG. 1 shows a typical differential amplifier 100 having driver transistors N1 and N2, load transistors P1 and P2, and a current source N3. Differential amplifier 100 receives differential signals INA and INB and outputs differential output signals OA and OB.

In most electronic circuits, a noise at the input signal can affect the output signal. In differential amplifier 100, since the INA and INB are differential signals, a noise that is common to the INA and INB signals may be absent from the differential component of the OA and OB signals. Although the common mode noise is absent from differential component of OA and OB signals, high frequency component of the common mode noise can still be transmitted to the outputs in common mode. This can create a problem when differential amplifier 100 drives a non-differential element. For example, FIG. 1 shows differential amplifier 100 driving an inverter 102.

FIG. 2 shows various signals for FIG. 1 in which differential amplifier 100 operates in two exemplary conditions; one condition has no noise and the other includes noise. As shown in FIG. 2, the transition point of the OUT signal of inverter 102 shifts by a time T because of the effect of the common node noise. This time shift may cause a circuit having differential amplifier 100 and inverter 102 to perform improperly.

Therefore, in some cases, differential amplifier 100 is unsuitable for driving a non-differential element. Conventional methods use various types of feedback to compensate the common mode noise or voltage shifts. This feedback usually requires that some of the common mode noise or the voltage shift be seen at the output before the proper compensation can be applied. This is inherently slow relative to some common mode noise that can be experienced.

SUMMARY OF THE INVENTION

The various embodiments of the present invention provide methods and circuits for reducing the common mode noise effect of differential amplifiers through a feed forward approach. This feed forward approach has the benefit of compensating nearly instantaneously. Therefore, much higher frequency common mode noise may be compensated.

In one aspect, a circuit includes a differential amplifier having a first differential input node and a second amplifier input node for receiving differential input signals, and having a first differential output node and a second differential output node for outputting differential output signals. An isolation unit connects in series with a supply path of the differential amplifier between a supply node and a compensation node. A capacitive network connects to the compensation node and the first and second differential amplifier input nodes. The isolation unit and the capacitive network form a compensation unit for reducing the effect of the common mode noise on the differential output signals. The capacitive network provides a feed forward path for the compensation.

In another aspect, a method of reducing the effect of the common mode noise includes receiving differential input signals at a plurality of input nodes of a differential amplifier. The method also includes generating differential output signals at a plurality of output nodes of the differential amplifier. The method further includes compensating a common mode noise affected on the differential output signals.

DETAILED DESCRIPTION OF THE INVENTION

Figure 1:
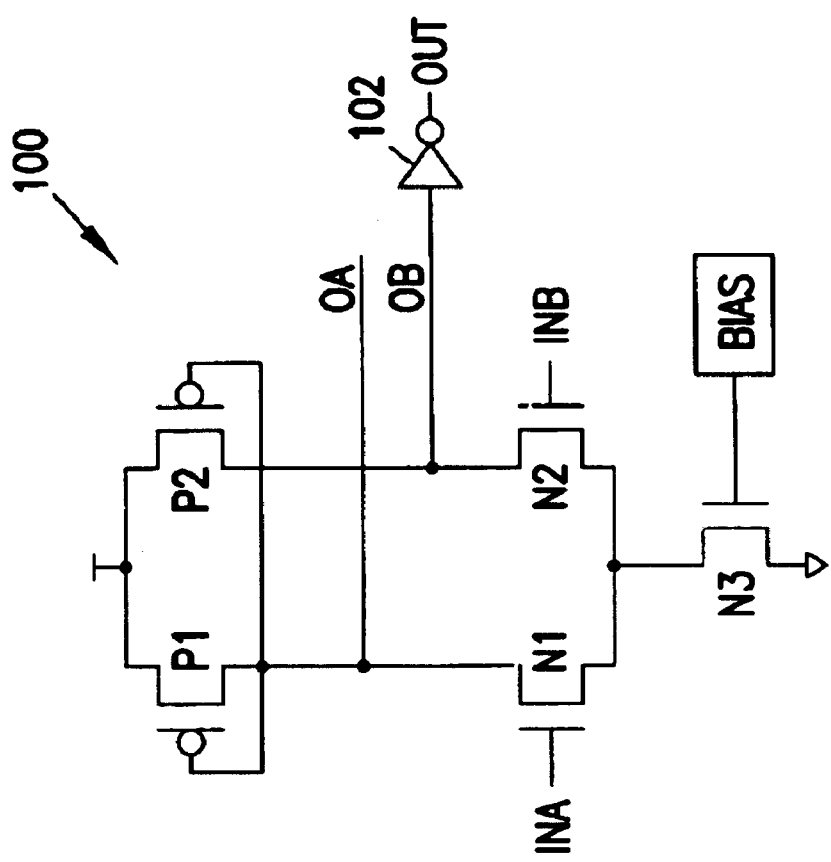
FIG. 1 shows a prior art differential amplifier.
Figure 2:
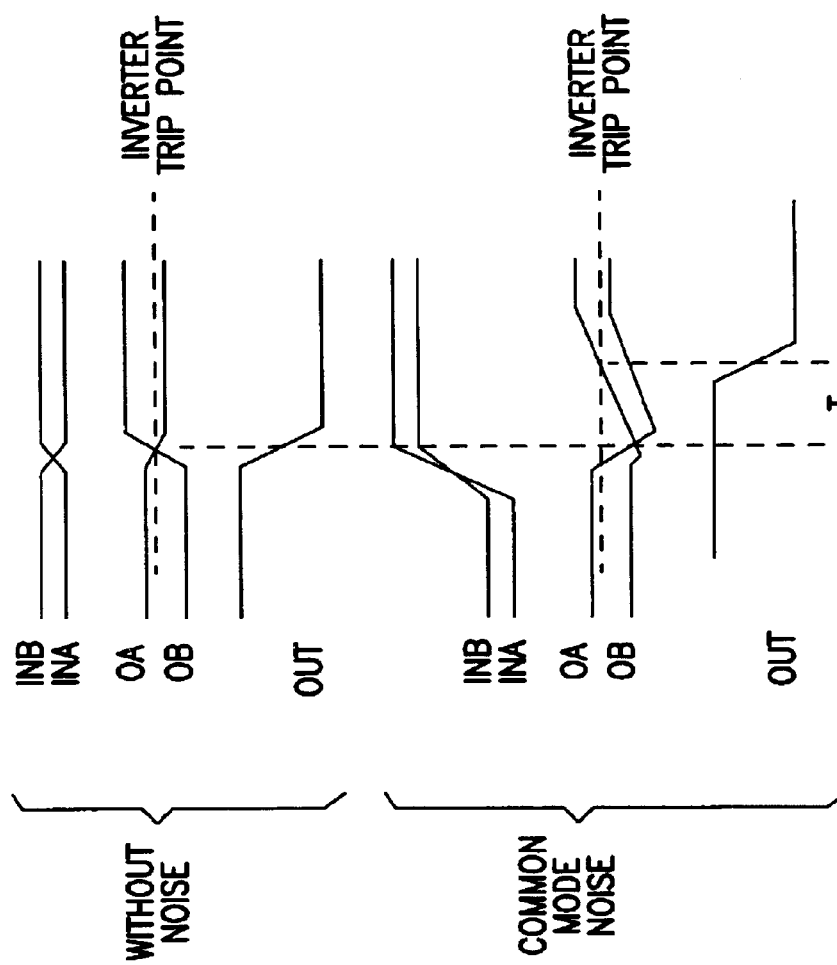
FIG. 2 shows various signals for FIG. 1.

The following description and the drawings illustrate specific embodiments of the invention sufficiently to enable those skilled in the art to practice it. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

Figure 3A:
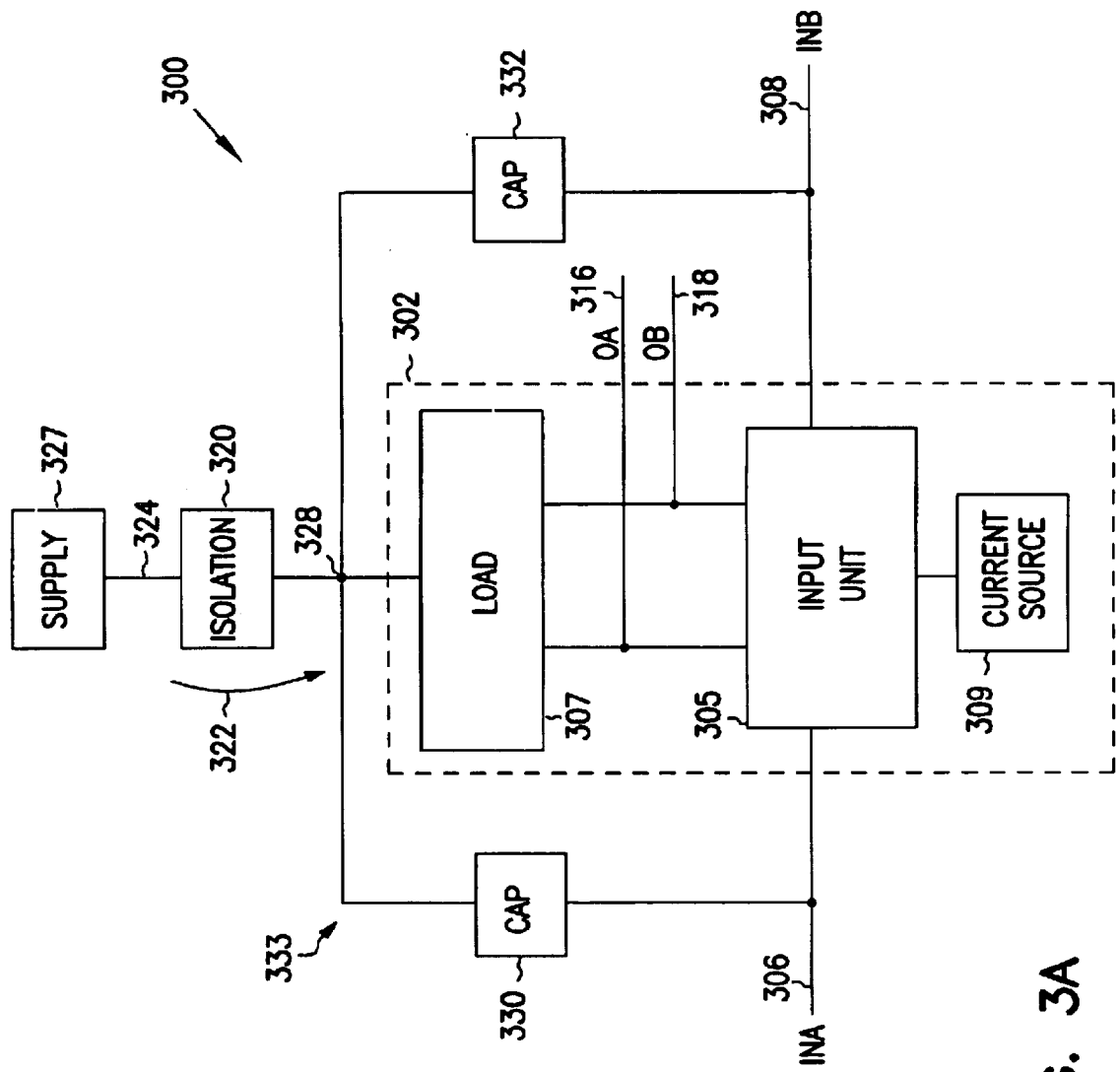
FIG. 3A shows an amplifying circuit according to an embodiment of the invention.

FIG. 3A shows an amplifying circuit 300 according to an embodiment of the invention. Amplifying circuit 300 includes a differential amplifier 302 having a differential input unit 305, a load unit 307, and a current source 309. Input unit 305 receives differential input signals INA and INB at differential input nodes 306 and 308 to generate differential output signals OA and OB at differential output nodes 316 and 318. An isolation unit 320 connects in series with a supply path 322 between a supply node 324 and a compensation node 328. A supply unit 327 provides a voltage to supply node 324. Capacitive elements 330 and 332 form a capacitive network 333 connected to differential amplifier 302 at compensation node 328 and input nodes 306 and 308.

Isolation unit 320 and capacitive network 333 form a compensation unit to reduce the effect of the common mode noise on the OA and OB signals of differential amplifier 302, in which capacitive network 333 provides a feed forward path for the compensation.

Figure 3B:
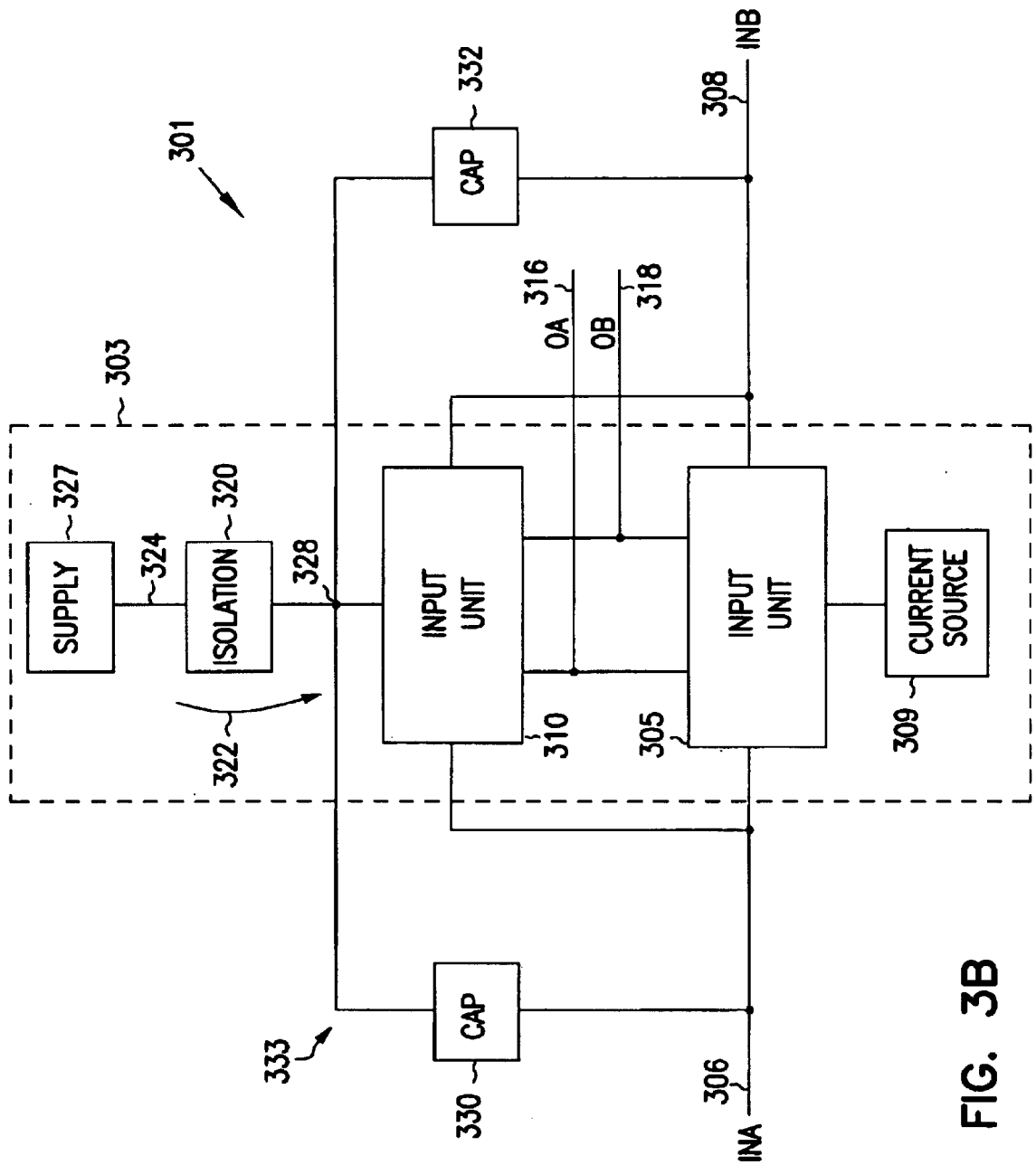
FIG. 3B shows an amplifying circuit according to another embodiment of the invention.

FIG. 3B shows an amplifying circuit 301 according to another embodiment of the invention. Amplifying circuit 301 includes a differential amplifier 303 having two differential input units 305 and 306, and a current source 309. Input units 305 and 310 receive differential input signals INA and INB at differential input nodes 306 and 308 to generate differential output signals OA and OB at differential output nodes 316 and 318. An isolation unit 320 connects in series with a supply path 322 between a supply node 324 and a compensation node 328. Capacitive elements 330 and 332 form a capacitive network 333 connected to differential amplifier 303 at compensation node 328 and input nodes 306 and 308. Isolation unit 320 has dual usage as a component of the original differential amplifier 303 in this embodiment.

Isolation unit 320 and capacitive network 333 form a compensation unit to reduce the effect of the common mode noise on the OA and OB signals of differential amplifier 303, in which capacitive network 333 provides a feed forward path for the compensation.

Figure 3C:
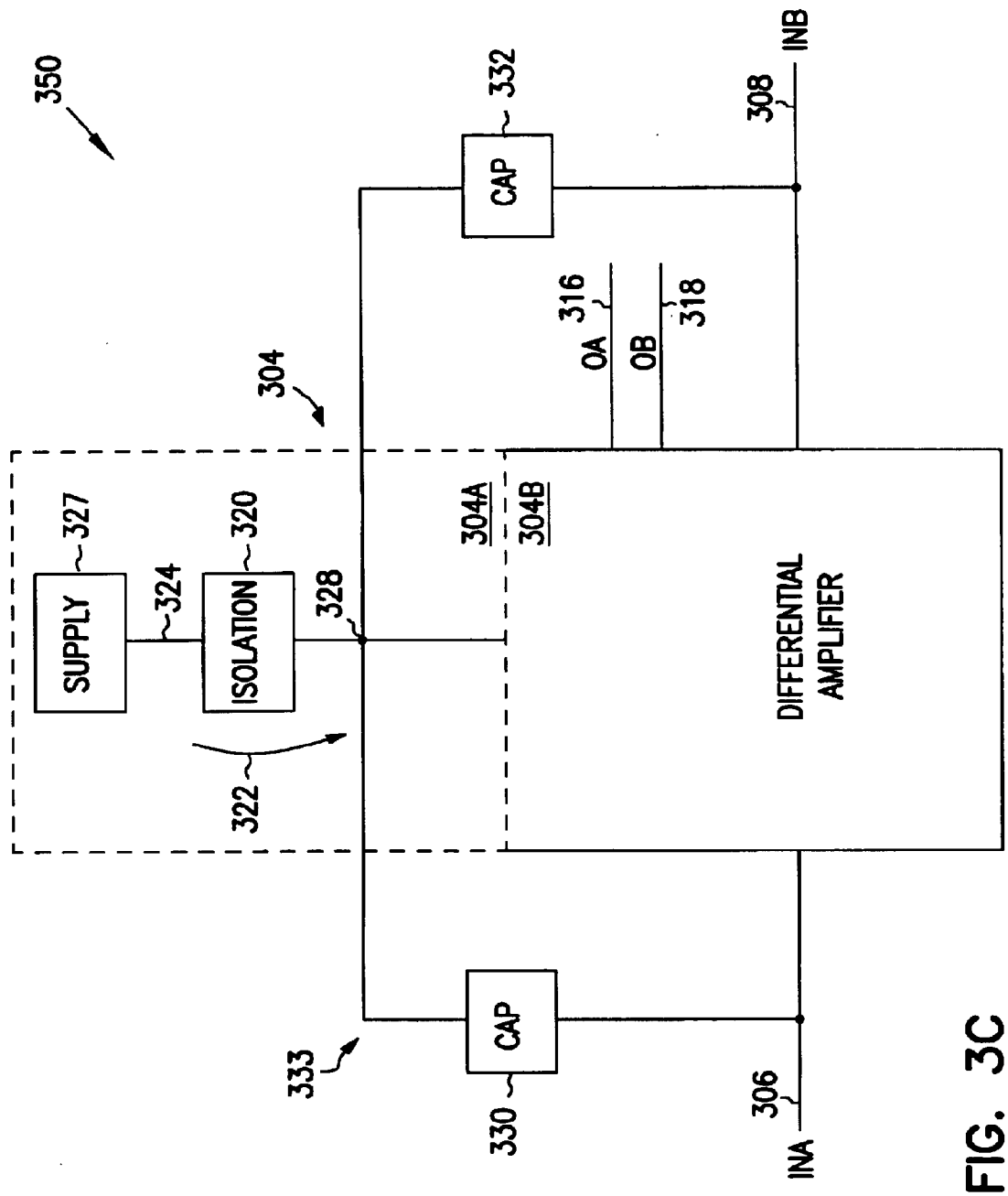
FIG. 3C shows an amplifying circuit according to another embodiment of the invention.

FIG. 3C shows an amplifying circuit 350 according to another embodiment of the invention. Amplifying circuit 350 includes a differential amplifier 304 having two differential input nodes 306 and 308 and two differential output nodes 316 and 318. An isolation unit 320 connects in series with a supply path 322 between a supply node 324 and a compensation node 328. Capacitive elements 330 and 332 form a capacitive network 333 connected to differential amplifier 304 at compensation node 328 and input nodes 306 and 308. Differential amplifier 304 has two cases: case A and case B. In case A, indicated by 304A, differential amplifier 304 has elements that can have a second use as isolation unit 320 and compensation node 328. In case B, indicated by 304B, isolation unit 320 and compensation node 328 reside outside of differential amplifier 304.

Isolation unit 320 and capacitive network 333 form a compensation unit to reduce the effect of the common mode noise on the OA and OB signals of differential amplifier 304, in which capacitive network 333 provides a feed forward path for the compensation.

In each of the FIGS. 3A, 3B and 3C, isolation unit 320 is intended to contain one or more resistive elements where the resistive elements can include elements other than resistors and capacitive network 333 can include any type of capacitive generating elements.

Figure 4A:
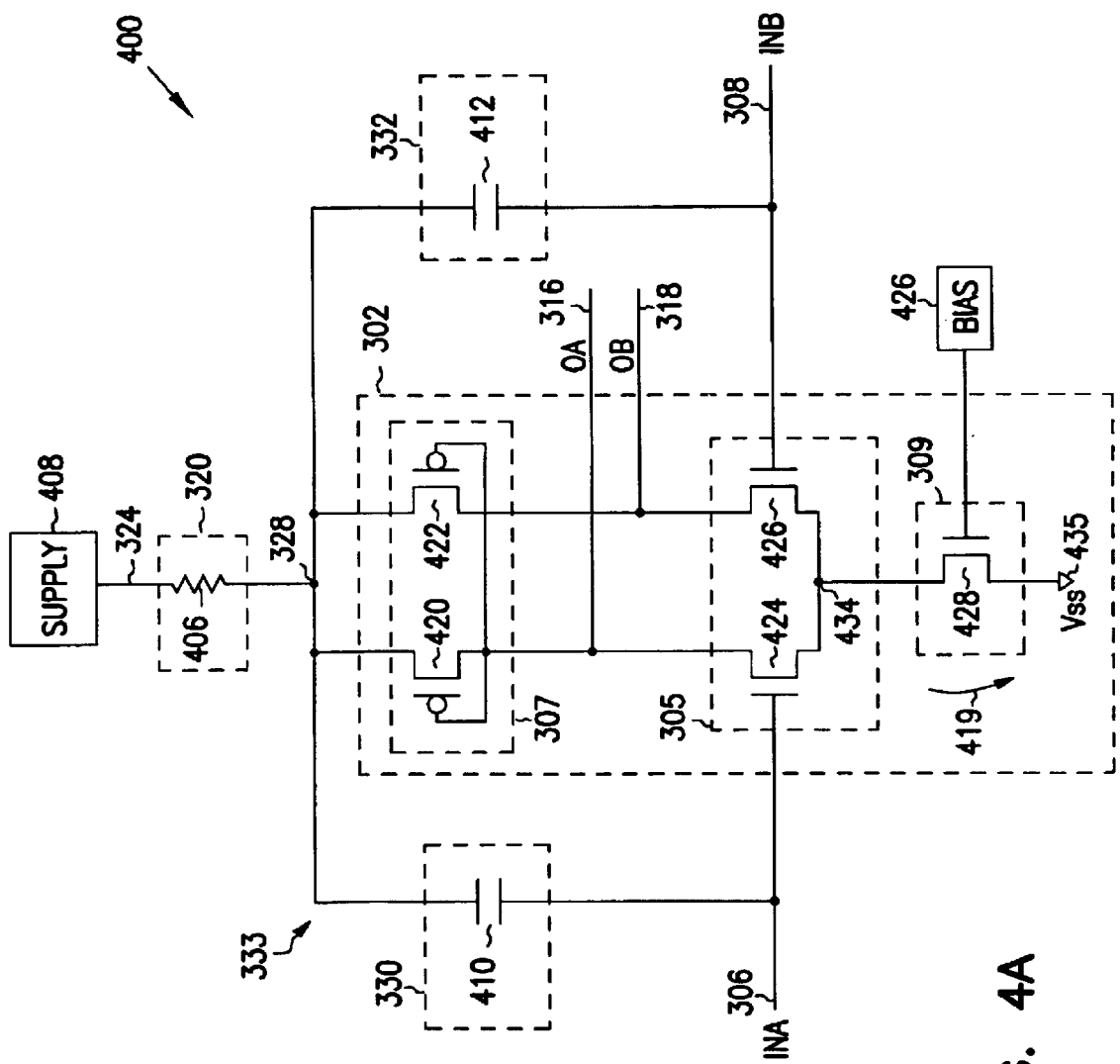
FIGS. 4A–B show amplifying circuits having transistors included in load units of the amplifying circuits according to embodiments of the invention.

FIG. 4A shows an amplifying circuit 400 according to another embodiment of the invention. Differential amplifier 302 is similar to the differential amplifier of FIG. 3A. Input unit 305 includes driver transistors 424 and 426 forming a differential pair to receive the INA and INB signals. Load unit 307 includes load transistors 420 and 422 connected between compensation node 328 and output nodes 316 and 318. Current source 309 includes a transistor 428 controlled by a bias unit 436 and connected in series with a current path 419 between a common node 434 and a supply node 435.

Transistor 420 has a source connected to compensation node 328, and a drain and a gate connected together at output node 316. Transistor 422 has a source connected to compensation node 328, gate connected to output node 316, and a drain connected at output node 318. Transistor 424 has a drain connected to output node 316, a source connected to common node 434, and a gate connected to input node 306. Transistor 426 has a drain connected to output node 318, a source connected to common node 434, and a gate connected to input node 308. Transistor 428 has a drain connected to common node 434, a source connected to supply node 435, and a gate connected to bias unit 436.

Isolation unit 320 includes a resistor 406 connected between a supply node 324 and compensation node 328. Capacitive network 333 includes a first capacitor 410 connected between input node 306 and compensation node 328, and a second capacitor 412 connected between input node 308 and compensation node 328.

In embodiments represented by FIG. 4, isolation unit 320 include a resistor and capacitive network 333 includes capacitors. In other embodiments, however, isolation unit 320 can include resistive elements other than resistors and capacitive network 333 can include any type of capacitive generating element.

Bias unit 436 can be any type of conventional circuit that is used for biasing a transistor such as transistor 428. The specification also refers to other bias units. These bias units, including bias unit 436, can be constructed by conventional methods that are known in the art. Therefore, detailed descriptions of all bias units in the specification are omitted.

Supply unit 408 provides a voltage equal to Vcc at node 324 and supply node 435 connects to Vss. In embodiments represented by FIG. 4A, Vcc is the supply voltage of differential amplifier 302 and is greater than Vss, where Vss is ground. In some embodiments, Vss is non-ground and has a smaller voltage than a voltage at node 324 provided by supply unit 408.

Transistors 424, 426 and 428 are n-channel metal oxide semiconductor field effect transistors (NMOSFETs), also referred to as "NFETs" or "NMOS". Transistors 420 and 422 are p-channel metal oxide semiconductor field effect transistors (PMOSFETs), also referred to as "PFETs" or "PMOS". Other types of transistors can also be used in place of the NMOS and PMOS transistors of FIG. 4A. For example, embodiments exist that use bipolar junction transistors (BJTs) and junction field effect transistors (JFETs). One of ordinary skill in the art will understand that many other types of transistors can be used in alternative embodiments of the invention.

Resistor 406 and capacitors 410 and 412 form a compensation unit to reduce the effect of the common mode noise on the OA and OB signals. Resistor 406 isolates the sources of load transistors 420 and 422 at node 328 from the voltage at node 324. This allows capacitors 410 and 412 to reduce the effect of the common mode noise on the OA and OB signals. For example, when both of the INA and INB signals increase due to noise, the voltage at node 434 does not increase as quickly. This tends to pull down the signal levels of both OA and OB signals. However, since capacitors 410 and 412 connect to resistor 406 and the sources of both load transistors 420 and 422 at node 328, capacitors 410 and 412 pull up the voltage level of node 328. When the voltage level of node 328 increases, it pulls up the levels of the OA and OB signals through load transistors 420 and 422. Thus, capacitors 410 and 412 indirectly pull up the signal levels of the OA and OB signals through load transistors 420 and 422 when the INA and INB signals increase. This reduces the pulling down of the signal levels of the OA and OB signals by node 434. As a result, the effect of the common mode noise on the OA and OB signals is reduced or compensated.

Figure 4B:
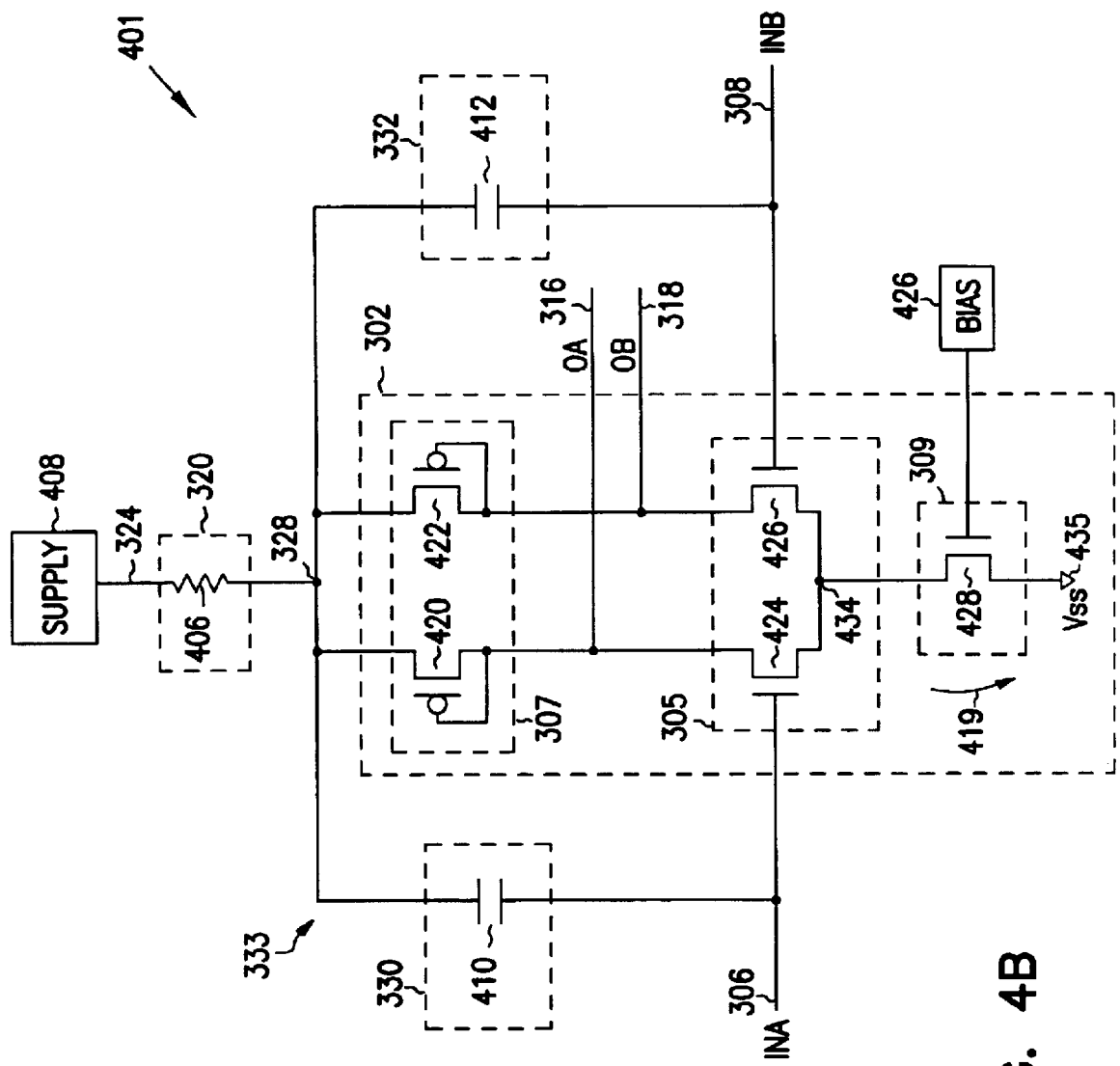

FIG. 4B shows an amplifying circuit according to another embodiment of the invention. Circuit 401 has elements that are similar to the elements of circuit 400 (FIG. 4). In FIG. 4B, load transistors 420 and 422 have their gate nodes tied to their respective drain nodes 316 and 318. Circuit 401 has a similar compensation unit as that of circuit 400 to reduce the effect of the common mode noise on the output signals.

Figure 5:
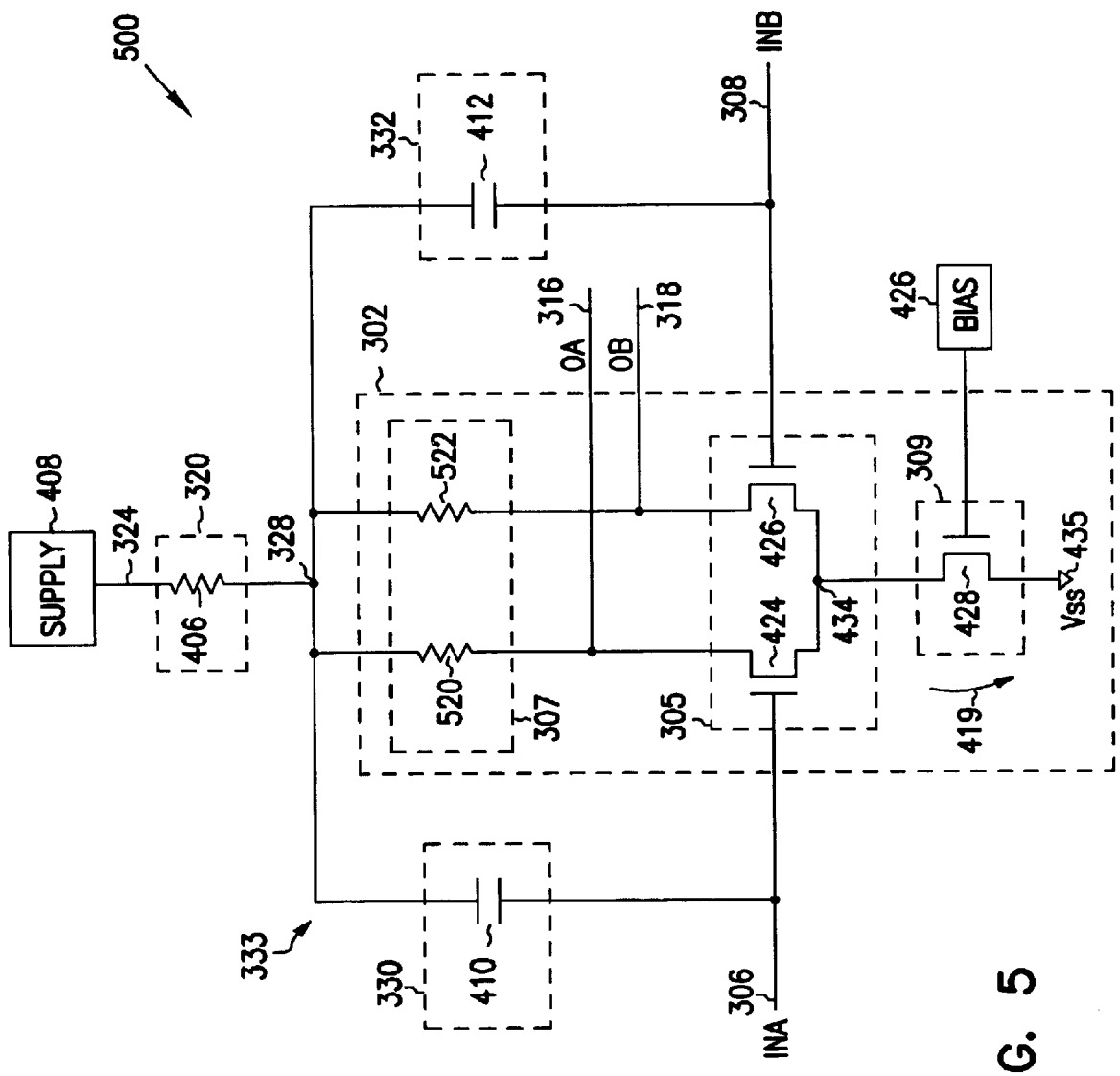
FIG. 5 shows an amplifying circuit having resistors included in a load unit according to an embodiment of the invention.

FIG. 5 shows an amplifying circuit according to another embodiment of the invention. Circuit 500 has elements that are similar to the elements of circuit 400 (FIG. 4A). In FIG. 5, load unit 307 includes resistors 520 and 522. Circuit 500 has a similar compensation unit as that of circuit 400 to reduce the effect of the common mode noise on the output signals.

Figure 6A:
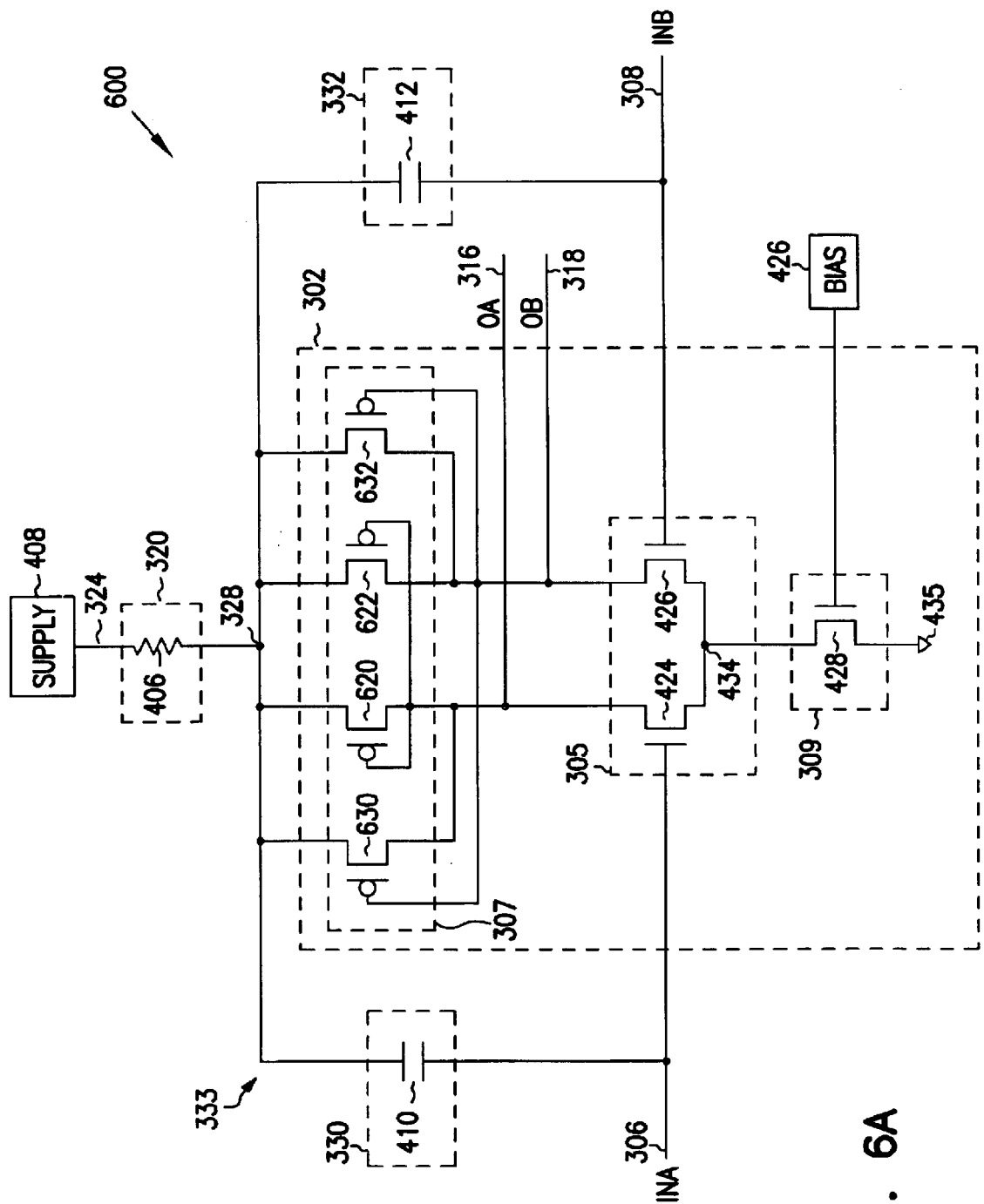
FIGS. 6A–B show amplifying circuits according to other embodiments of the invention.

FIG. 6A shows an amplifying circuit according to another embodiment of the invention. Circuit 600 has elements that are similar to the elements of circuit 400 (FIG. 4A). In FIG. 6A, load unit 307 includes multiple transistors 620, 622, 630, and 632 connected between output nodes 316 and 318 and compensation node 328. Circuit 600 has a similar compensation unit as that of circuit 400 to reduce the effect of the common mode noise at the output signals.

Figure 6B:
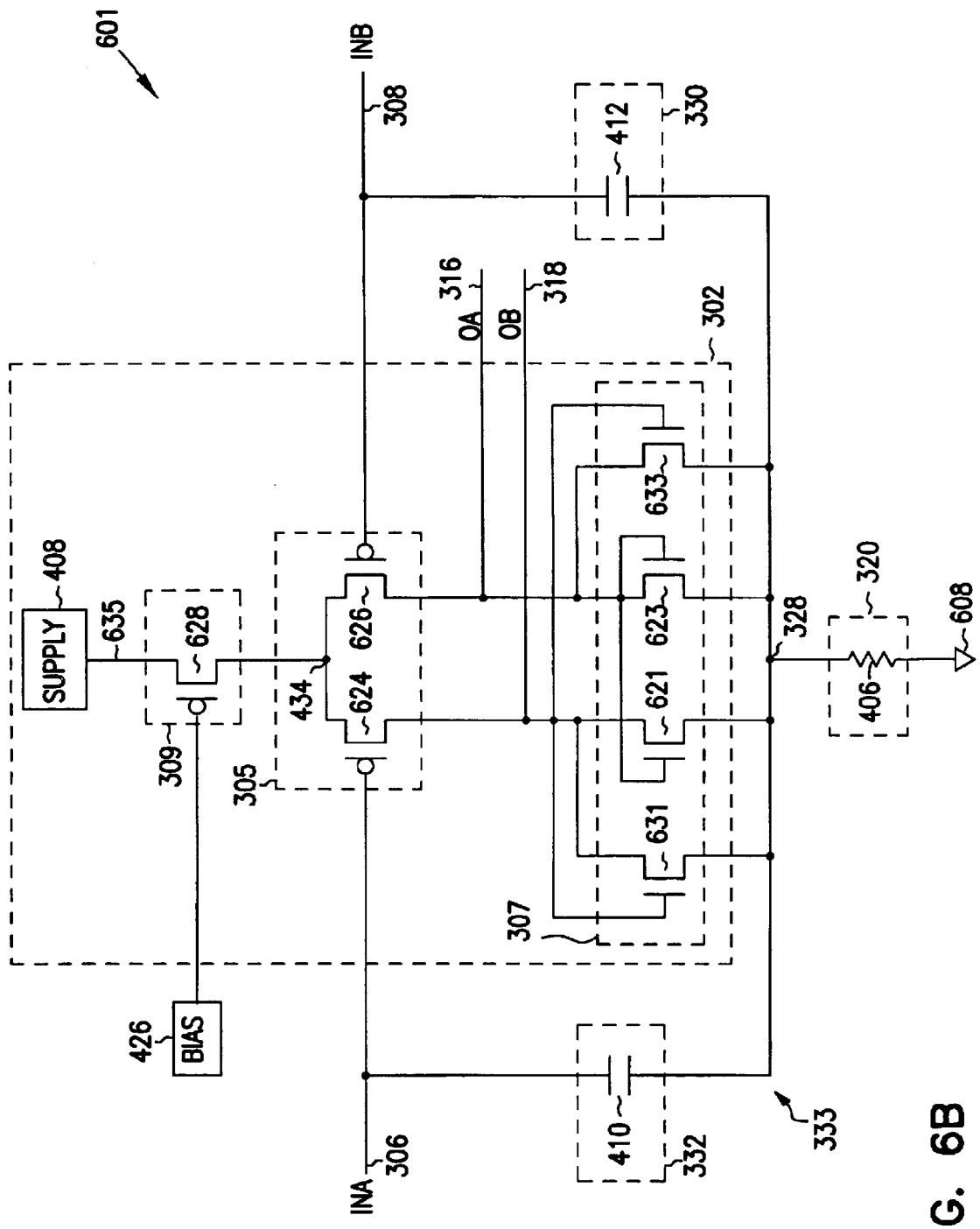

FIG. 6B shows an amplifying circuit according to another embodiment of the invention. Circuit 601 is similar to circuit 600 (FIG. 6) but with P-channel transistor types swapped with N-channel transistor types and N-channel transistor types swapped with P-channel transistor types as well as supply node types swapped such that supply node 608 connects to Vss and supply node 635 connects to supply unit 408 to receive the supply voltage Vcc. Circuit 601 has a similar compensation unit as that of circuit 600 to reduce the effect of the common mode noise at the output signals.

Figure 7A:
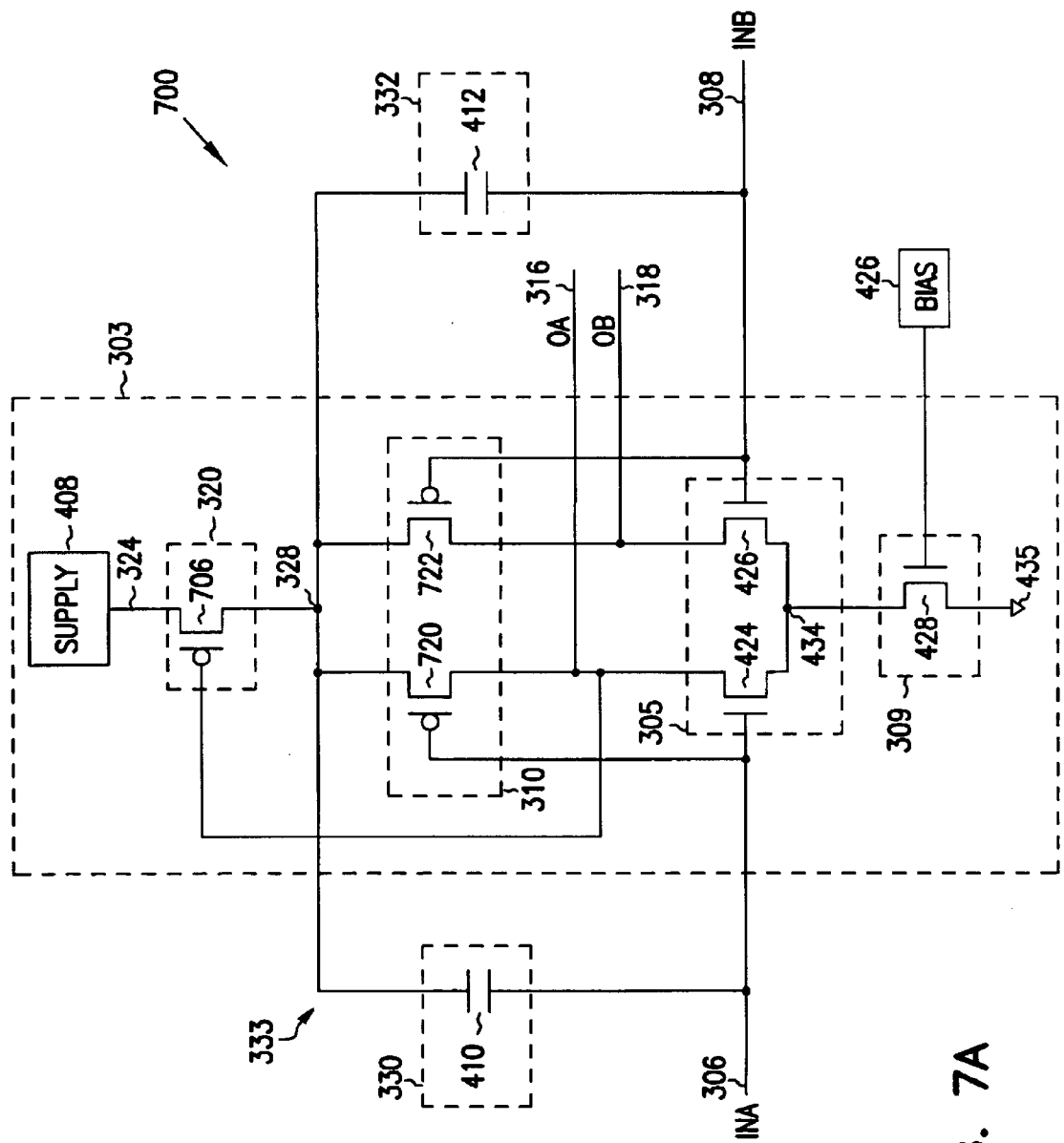
FIGS. 7A–B show amplifying circuits including variations of the Bazes differential amplifier according to embodiments of the invention.

FIG. 7A shows an amplifying circuit 700 according to another embodiment of the invention. Input unit 305 includes driver transistors 424 and 426 and input unit 310 includes driver transistors 720 and 722 forming two differential pair to receive the INA and INB signals. Transistors 720 and 722 connect between compensation node 328 and output nodes 316 and 318. Current source 309 includes a transistor 428 controlled by a bias unit 436 and connected in series with a current path 419 between a common node 434 and a supply node 435.

Transistor 720 has a source connected to compensation node 328, a gate connected to input node 306, and a drain connected to output node 316. Transistor 722 has a source connected to compensation node 328, gate connected to input node 308, and a drain connected at output node 318. Transistors 424 has a drain connected to output node 316, and a source connected to common node 434, and a gate connected to input node 306. Transistor 426 has a drain connected to output node 318, a source connected to common node 434, and a gate connected to input node 308. Transistor 428 has a drain connected to common node 434, a source connected to supply node 435, and a gate connected to bias unit 436.

In FIG. 7A, isolation unit 320 includes a transistor 706 connected between a supply node 324 and compensation node 328. Capacitive network 333 includes a first capacitor 410 connected between input node 306 and compensation node 328, and a second capacitor 412 connected between input node 308 and compensation node 328. Transistor 706 has dual functionality acting as a component of differential amplifier 303 as well as use in isolation unit 320.

In embodiments represented by FIG. 7A, isolation unit 320 includes a transistor and capacitive network 333 includes capacitors. In other embodiments, however, isolation unit 320 can include resistive elements other than transistors and capacitive network 333 can include any type of capacitive generating elements.

Supply unit 408 provides a voltage equal to Vcc at node 324 and supply node 435 connects to Vss. Bias unit 436 can be any type of conventional circuit.

The specification points out transistors 424, 426 and 428 can be transistor types other than n-channel metal oxide semiconductor field effect transistors (NMOSFETs). And likewise transistors 720 and 722 can be transistor types other than p-channel metal oxide semiconductor field effect transistors (PMOSFETs).

Transistor 706 and capacitors 410 and 412 form a compensation unit to reduce the effect of the common mode noise on the OA and OB signals. Although transistor 706 has function as part of differential amplifier 303, it also serves to isolate the sources of input transistors 720 and 722 at node 328 from the voltage at node 324 in the context of a compensation unit. This allows capacitors 410 and 412 to reduce the effect the common mode noise on the OA and OB signals. For example, when both of the INA and INB signals increase due to noise, the voltage at node 434 does not increase as quickly. This tends to pull down the signal levels of both OA and OB signals. However, since capacitors 410 and 412 connect to transistor 706 and the sources of both input transistors 720 and 722 at node 328, capacitors 410 and 412 pull up the voltage level of node 328. When the voltage level of node 328 increases, it pulls up the levels of the OA and OB signals through input transistors 720 and 722. Thus, capacitors 410 and 412 indirectly pull up the signal levels of the OA and OB signals through input transistors 720 and 722 when the INA and INB signals increase. This reduces the pulling down of the signal levels of the OA and OB signals by node 434. As a result, the effect of the common mode noise effect is reduced or compensated.

Figure 7B:
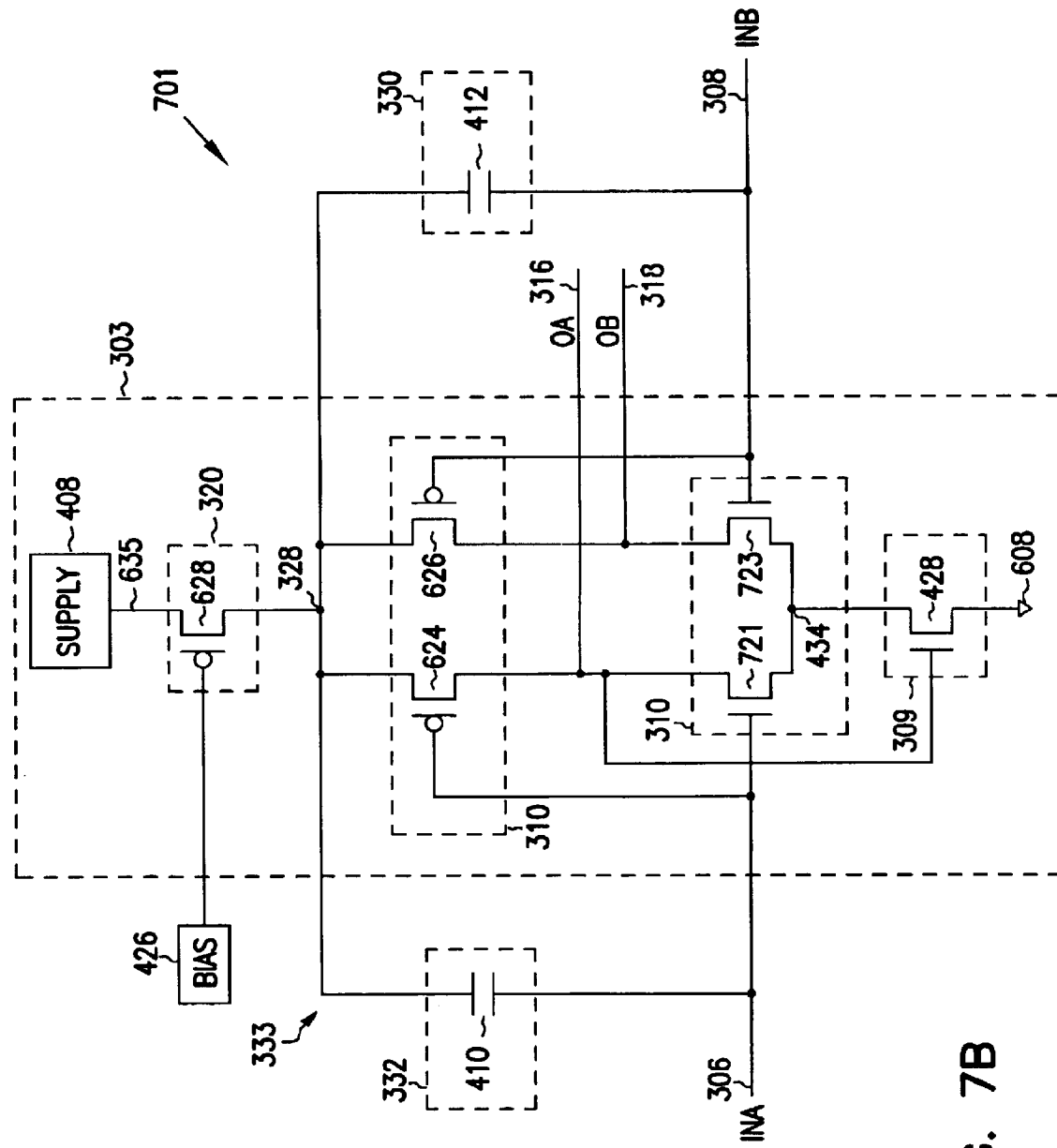

FIG. 7B shows an amplifying circuit according to another embodiment of the invention. Circuit 701 is similar to circuit 700 (FIG. 7A) but with P-channel transistor types swapped with N-channel transistor types and N-channel transistor types swapped with P-channel transistor types as well as supply node types swapped such that supply node 608 connects to Vss and supply node 635 connects to supply unit 408 to receive the supply voltage Vcc. Circuit 701 has a similar compensation unit as that of circuit 700 to reduce the effect of the common mode noise at the output signals.

Figure 8:
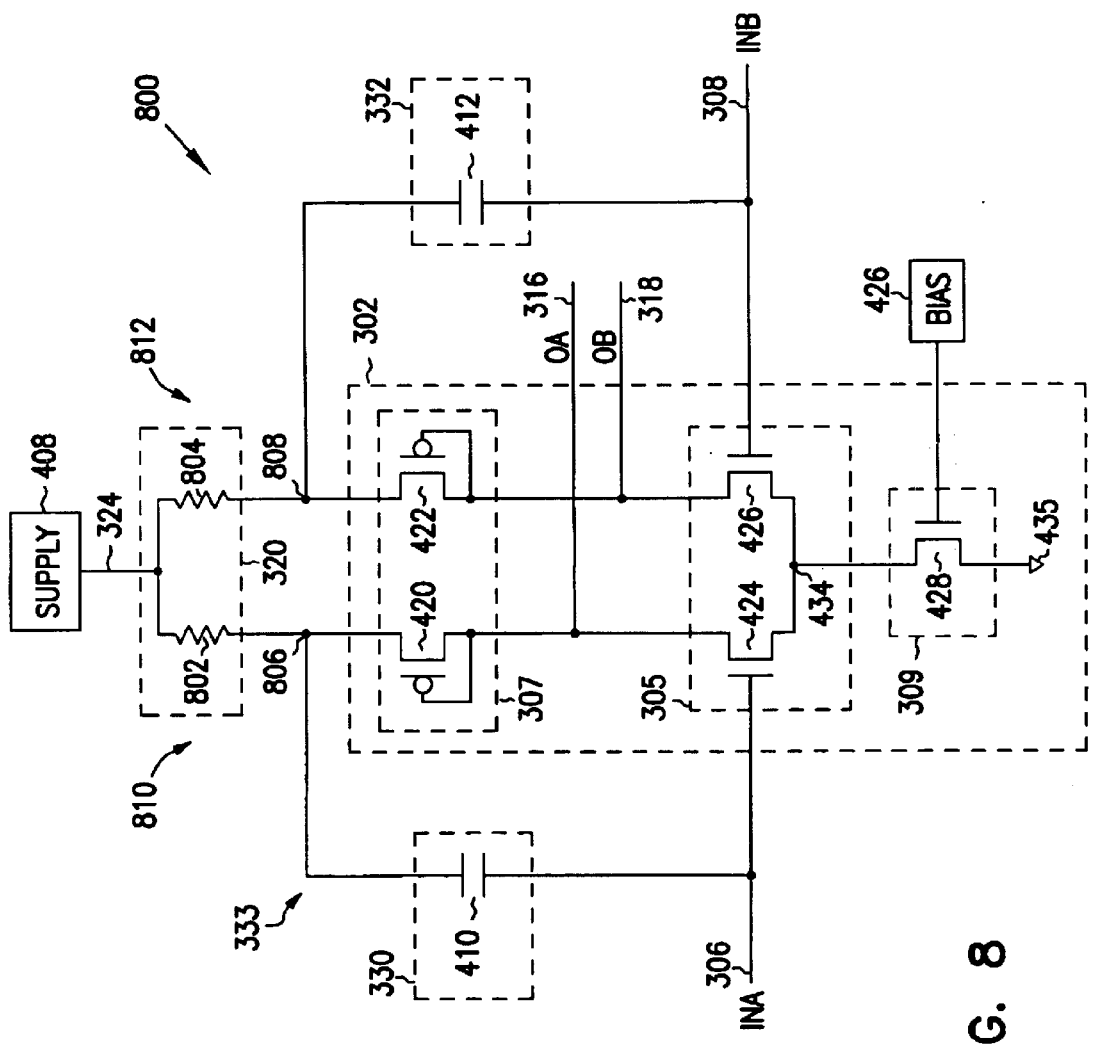
FIG. 8 shows an amplifying circuit having multiple compensation nodes according to an embodiment of the invention.

FIG. 8 shows an amplifying circuit according to another embodiment of the invention. Circuit 800 has elements that are similar to the elements of circuit 400 (FIG. 4A). In FIG. 8, isolation unit 320 includes resistors 802 and 804. Resistor 802 connects between supply node 324 and a compensation node 806. Resistor 804 connects between supply node 324 and a compensation node 808. Circuit 800 includes two symmetrical branches 810 and 812. Branch 810 includes resistor 802, transistors 420 and 424, and capacitor 410. Branch 812 includes resistor 804, transistors 422 and 426, and capacitor 412. Circuit 800 has a similar compensation unit as that of circuit 400 to reduce the effect of the common mode noise at the output signals.

Figure 9:
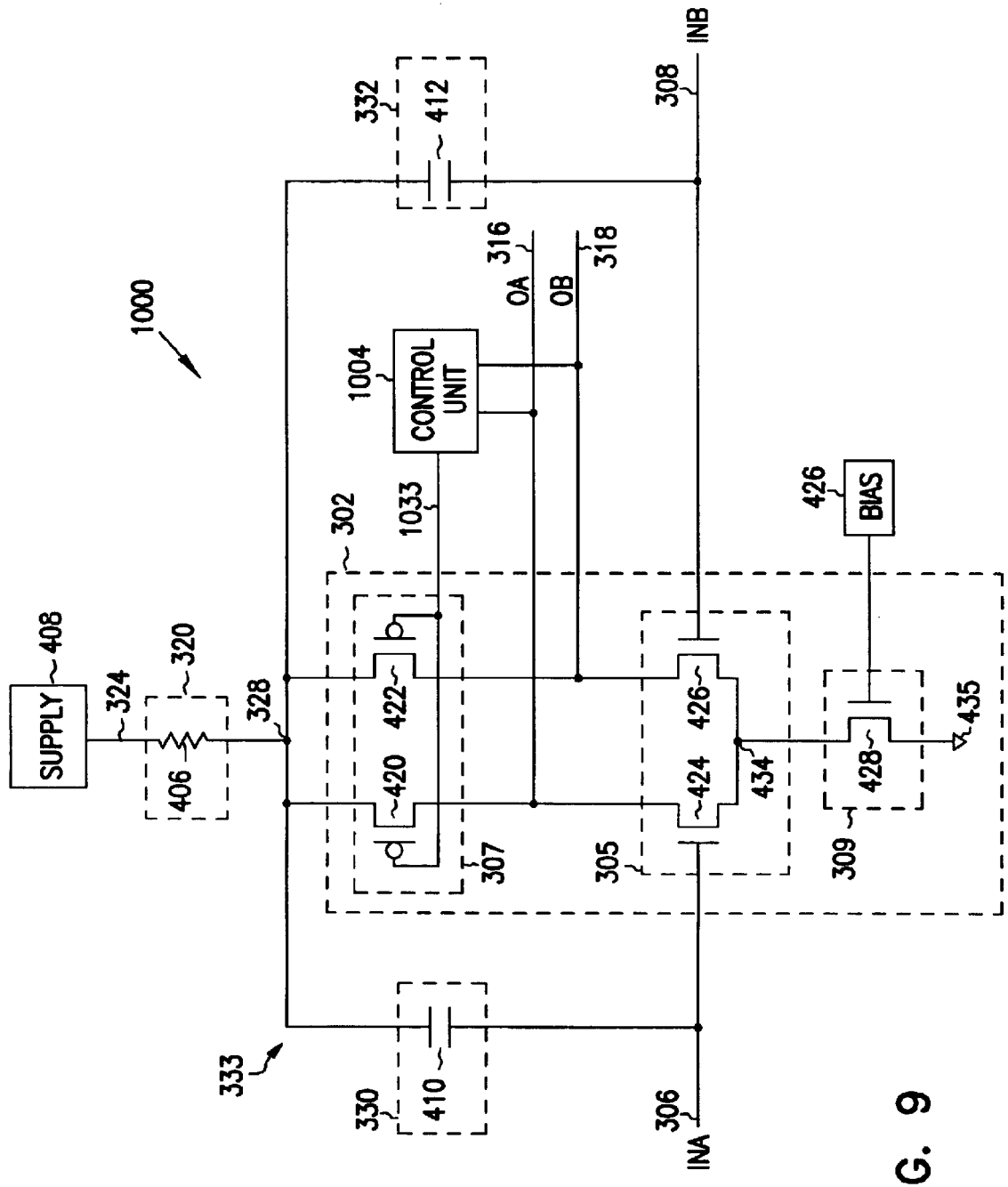
FIG. 9 shows an amplifying circuit having a control unit according to an embodiment of the invention.

FIG. 9 shows an amplifying circuit according to another embodiment of the invention. Circuit 1000 has elements that are similar to the elements of circuit 400 (FIG. 4A). Further circuit 1000 includes a control unit 1004 for improving the output swing of the voltage levels of output nodes 316 and 318 at high frequencies (improved frequency response).

Control unit 1004 includes a pair of input nodes connected to output nodes 316 and 318, and an output node connected to a load node 1033. As shown in FIG. 9, the gates of load transistors 420 and 422 indirectly connect to output nodes 316 and 318 through control unit 1004. In this arrangement, control unit 1004 effectively isolates the gates of load transistors 420 and 422 from output nodes 316 and 318 to reduce the capacitive effect of load transistors 420 and 422 on output nodes 316 and 318. This improves the output swing of the voltage levels of output nodes 316 and 318 at high frequencies, thereby improving the frequency response of circuit 1000.

Figure 10:
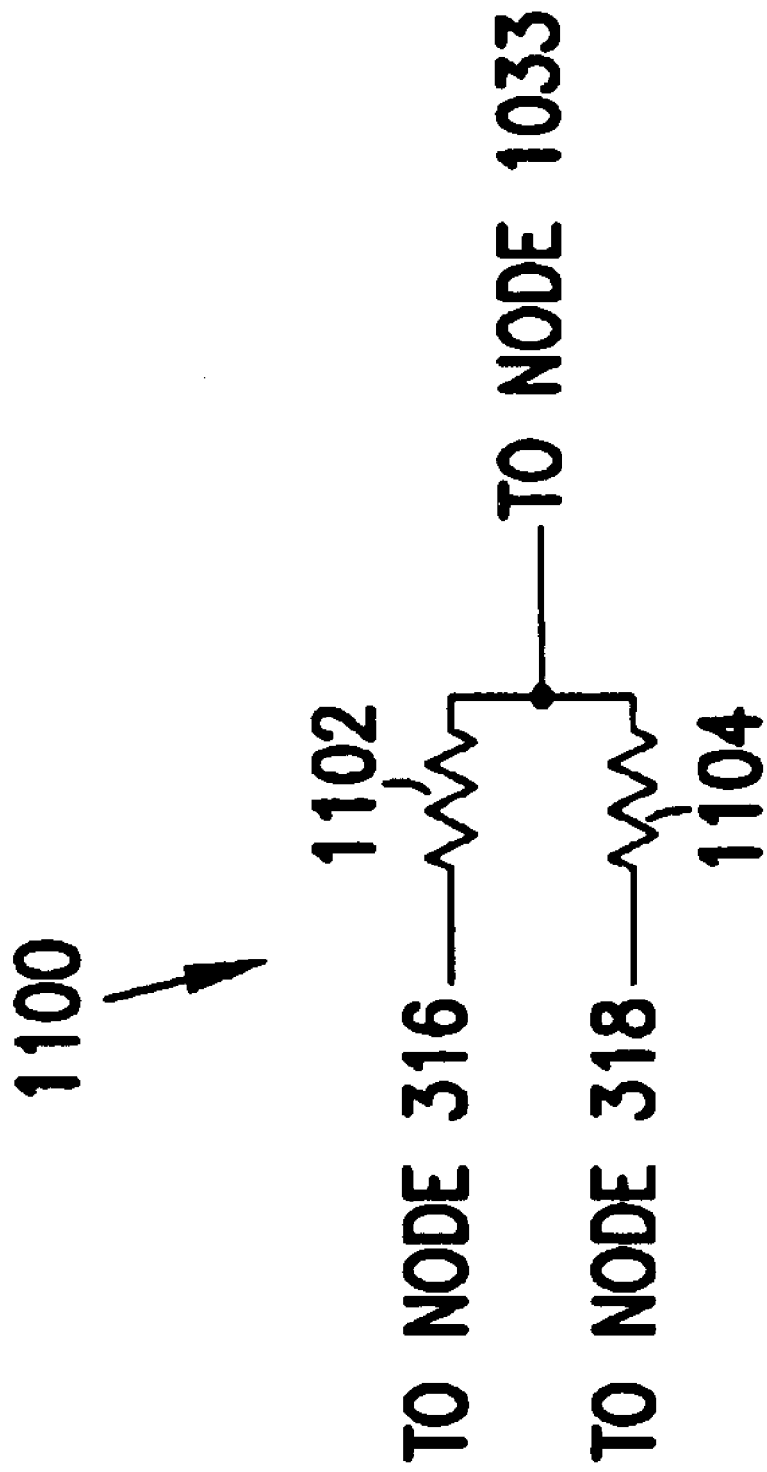
FIGS. 10–11 show the control circuit of FIG. 9.

FIG. 10 shows a control unit according to an embodiment of the invention. Control unit 1100 can substitute control unit 1004 of FIG. 9. Control unit 1100 includes resistive elements 1102 and 1104. In embodiments represented by FIG. 10, resistive elements 1102 and 1104 are resistors. In other embodiments, resistive elements 1102 and 1104 can be transistors operating as resistors. Each of the resistive elements 1102 and 1104 connects between load node 1033 and one of the output nodes 316 and 318.

The values of resistors 1102 and 1104 can be chosen to minimize the load on output nodes 316 and 318. These values depend on the range of the INA and INB signals. In some embodiments, resistive elements 1102 and 1104 have the same resistance. In other embodiments, resistive elements 1102 and 1104 have different resistances. Resistive element 1102 and 1104 reduce the capacitive effect of load transistors 420 and 422 on output nodes 316 and 318 to improve the speed of circuit 1000 (FIG. 9).

Figure 11:
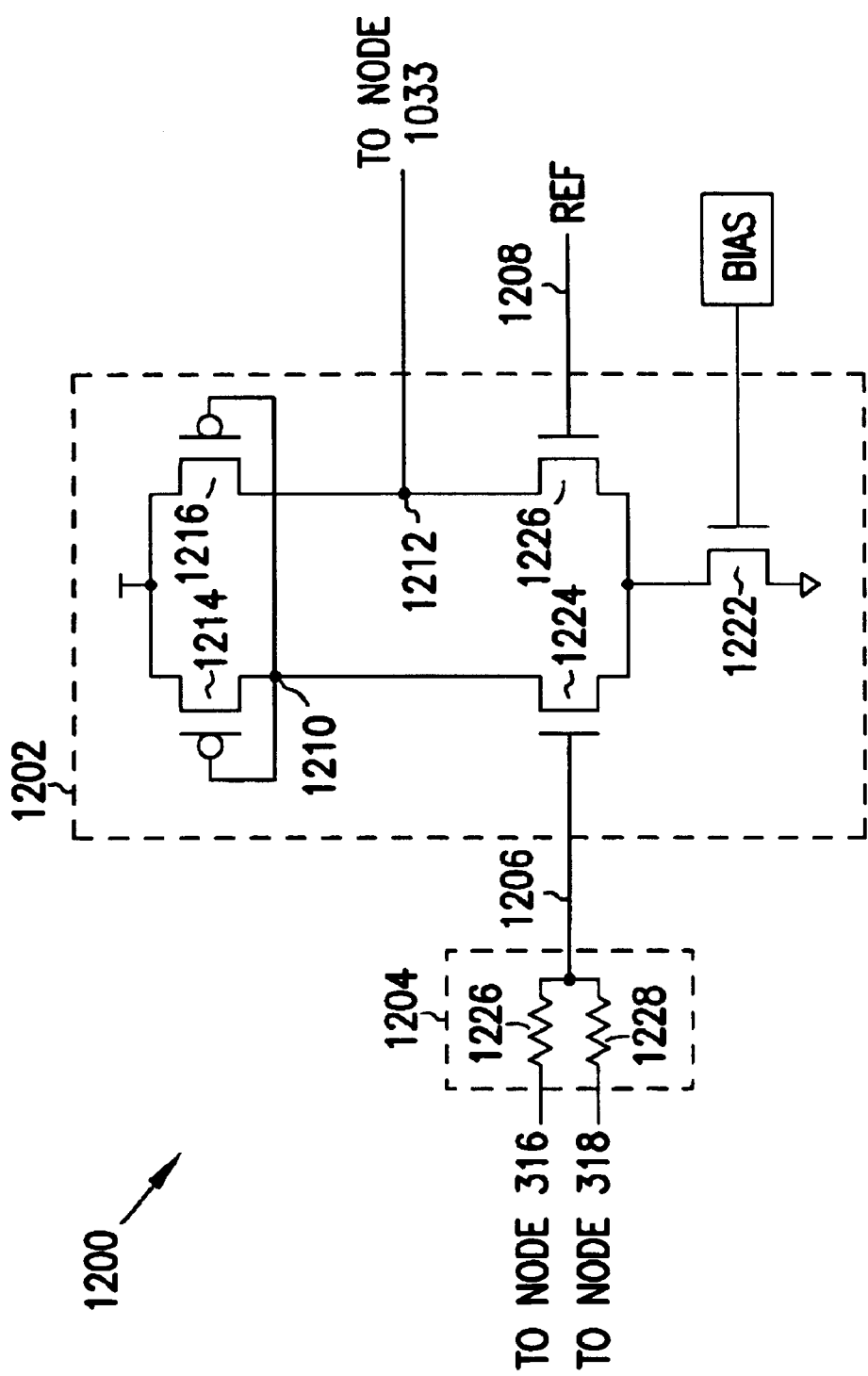

FIG. 11 shows a control unit according to another embodiment of the invention. Control unit 1200 can substitute control unit 1004 of FIG. 9. Control unit 1200 includes a control differential amplifier 1202 and a resistive network 1204. Control differential amplifier 1202 includes a pair of control input nodes 1206 and 1208, a pair of control output nodes 1210 and 1212, a pair of load transistors 1214 and 1216, a pair of driver transistors 1218 and 1220, and a current source transistor 1222. Transistor 1226 is controlled by a reference voltage REF. Transistor 1222 is controlled by bias unit 1224. Control output node 1212 connects to node 1033 of circuit 1000 (FIG. 9).

Resistive network 1204 includes resistive elements 1226 and 1228. In embodiments represented by FIG. 11, resistive elements 1226 and 1228 are resistors. Resistive element 1226 connects between output node 316 and control input node 1206. Resistive element 1228 connects between output node 318 and control input node 1206.

Figures 12A, 12B, 12C:
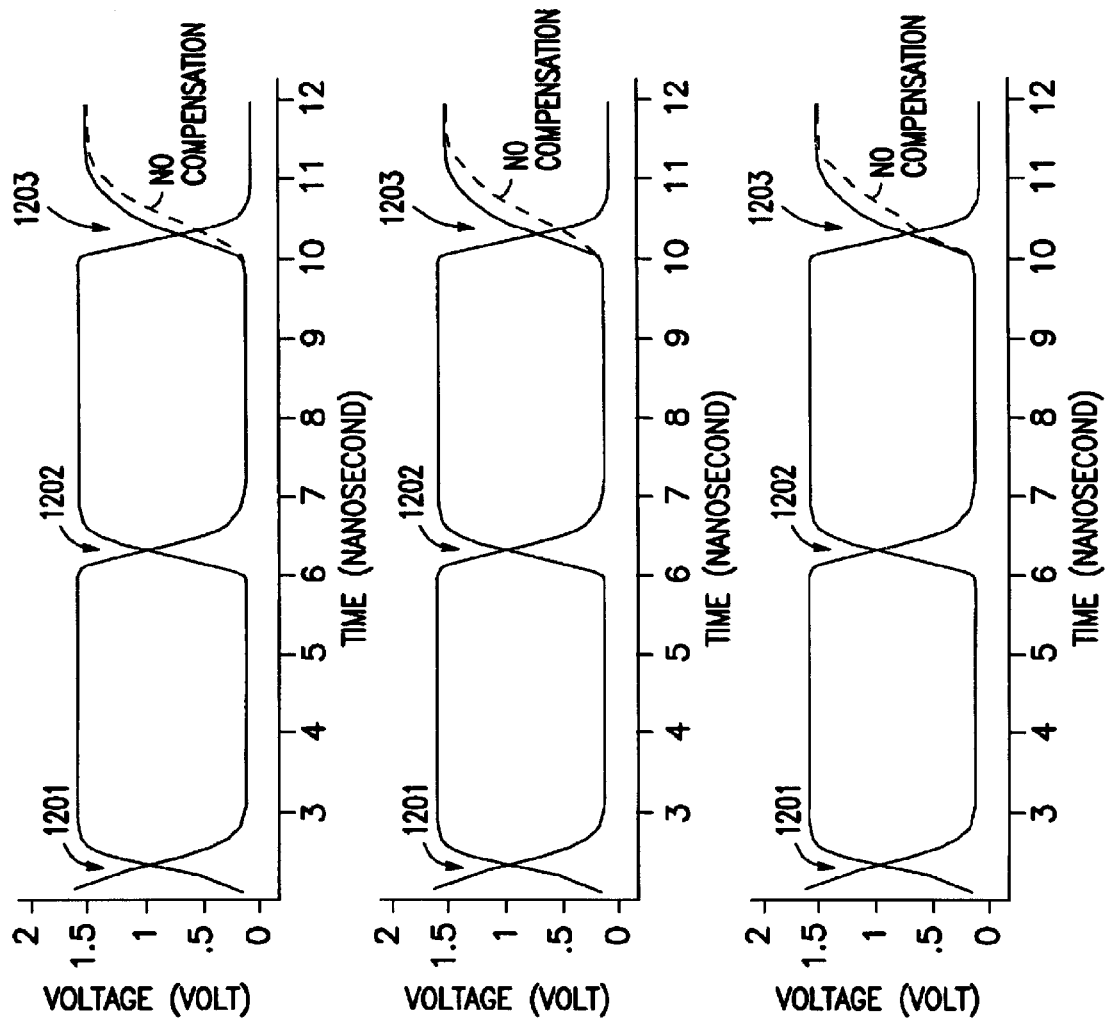
FIGS. 12A–12C show comparative simulation waveforms for a differential amplifier with and without common mode compensation.

FIGS. 12A–12C show simulation waveforms for a circuit similar to circuit 1000 (FIG. 9) and circuit 1000 without common mode noise compensation. Each of the FIGS. 12A–12C has simulation curves for the output signals (OA and OB) in both cases (with compensation and without compensation) overlaying each other. The difference between each of the FIGS. 12A–12C is the time at which common mode noise is introduced. Each Figure has clean inputs on the first two transitions, 1201 and 1202. The third input transition (1203) has noise introduced for both amplifier types. In FIG. 12A, a 200 millivolts common mode noise is introduced at the input transition time plus 100 picoseconds for the third transition occurring around 10.5 nanoseconds. In FIG. 12B, a 200 millivolts common mode noise is introduced at the input transition time plus 200 picoseconds for the third transition occurring around 10.5 nanoseconds. In FIG. 12C, a 200 millivolts common mode noise is introduced at the input transition time plus 300 picoseconds for the third transition occurring around 10.5 nanoseconds. In each case, the uncompensated amplifier shows significantly impacted waveforms, where the wave marked "no compensation" shifts to the right as compared to the desired characteristics.

Figure 13:
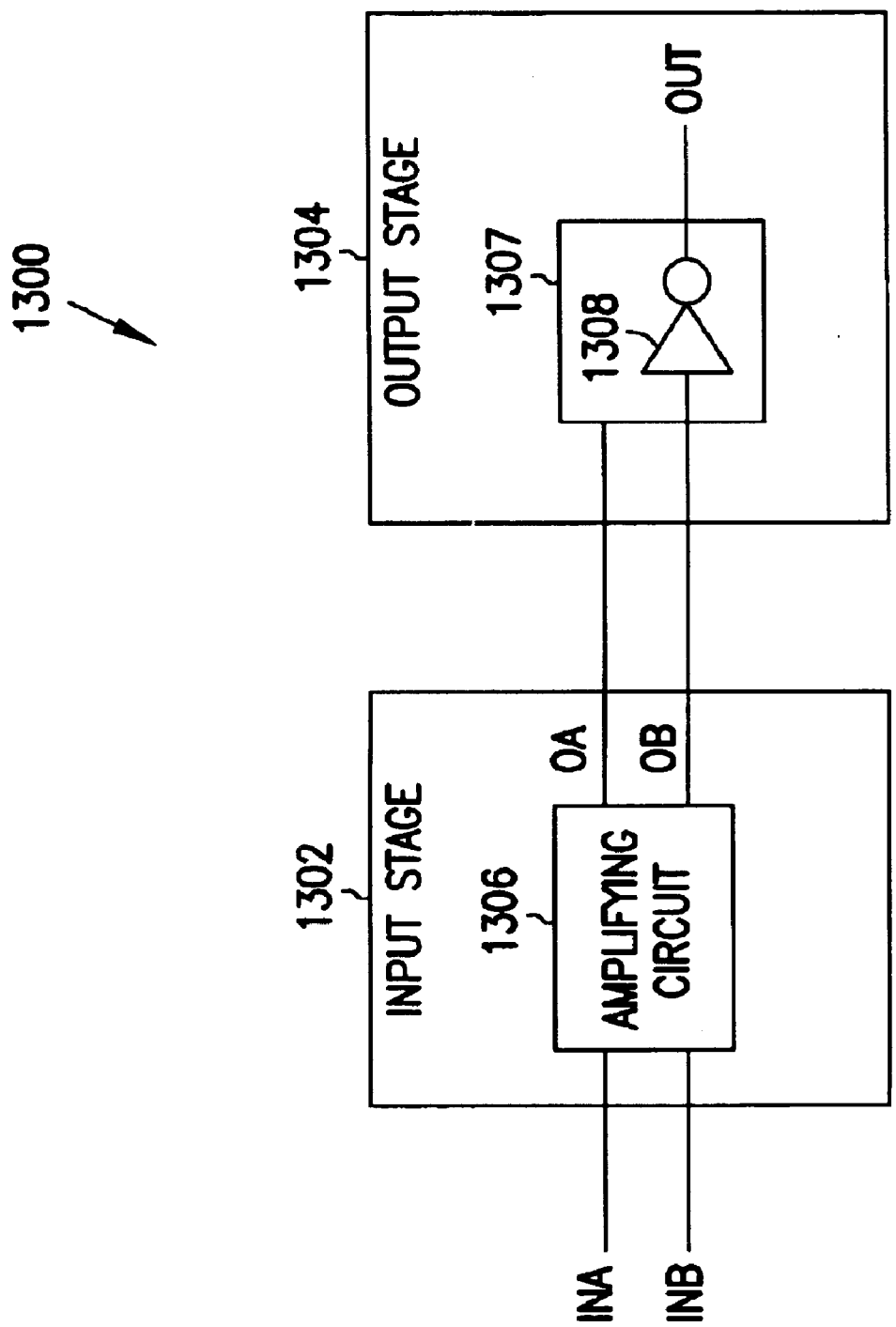
FIG. 13 shows an integrated circuit according to an embodiment of the invention.

FIG. 13 shows an integrated circuit including the amplifying circuit according to an embodiment of the invention. Integrated circuit 1300 includes an input stage 1302 and an output stage 1304. Input stage 1302 includes an amplifying circuit 1306 having input nodes for receiving differential input signals INA and INB and output nodes for outputting differential output signals OA and OB. Amplifying circuit 1306 can be any one of the amplifying circuits described in this specification. Output stage 1302 has a non-differential element 1307 connected to one of the output nodes of amplifying circuit 1306 for receiving one of the OA and OB signals to output a non-differential output signal OUT. A non-differential element generates an output signal based on a single input signal and not based on the difference between two input signals. An inverter is one example of a non-differential element.

In embodiments represented by FIG. 13, non-differential element 1307 includes an inverter 1308. In some embodiments, non-differential element 1307 can include elements or circuits besides inverters.

Amplifying circuit 1306 has a compensation unit similar to the compensation units of other amplifying circuits described in this specification. Thus, amplifying circuit 1306 has a reduced or compensated common mode noise effect on the OA and OB signals. This minimizes the time shift of the transition point of the OUT signal of inverter 1308 between a condition without noise and condition including noise.

Figure 14:
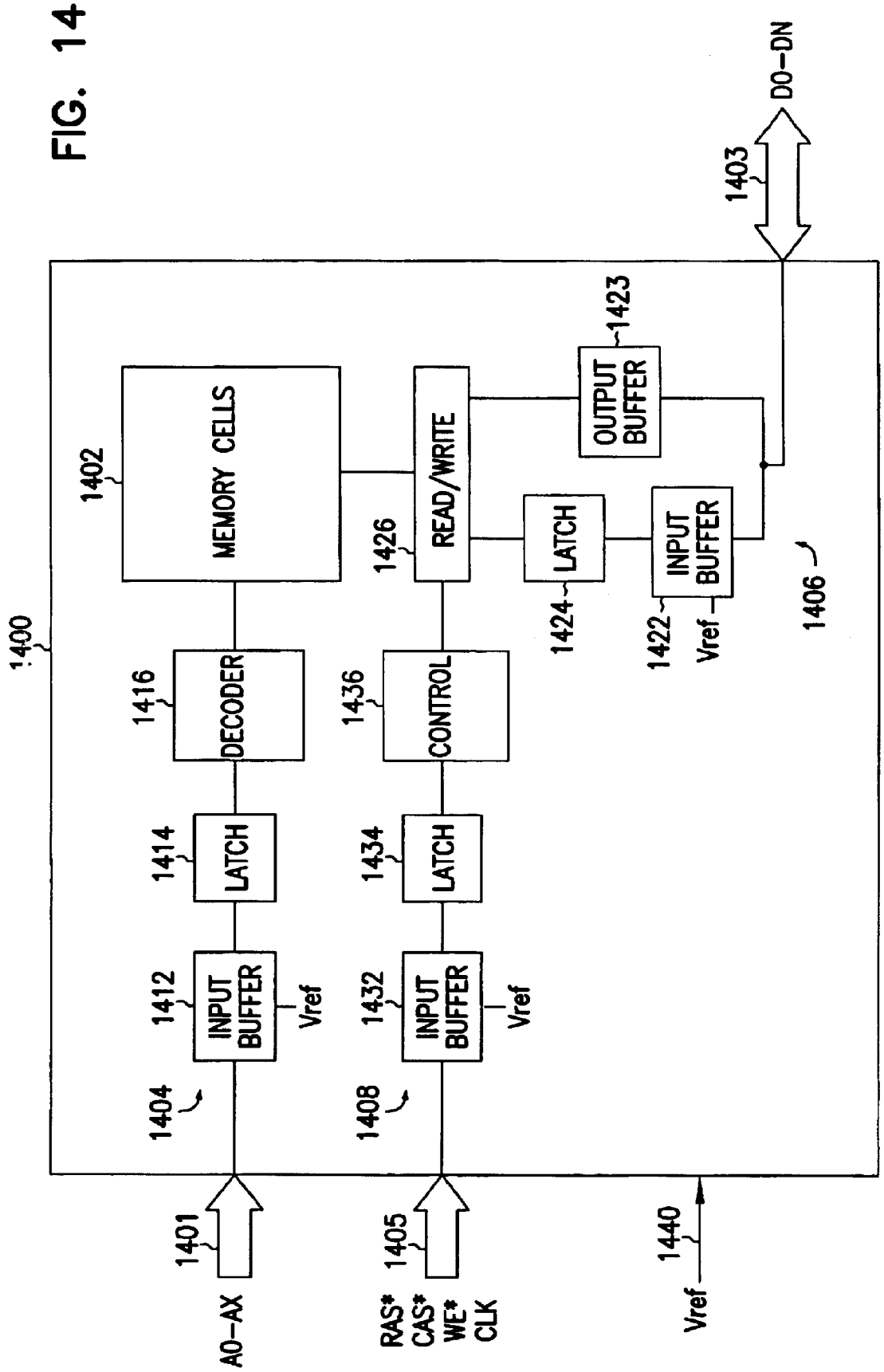
FIG. 14 shows a memory device according to an embodiment of the invention.

FIG. 14 shows a memory device according to an embodiment of the invention. Memory 1400 includes a plurality of address lines 1401 for receiving a plurality of address signals A0–AX, a plurality of data lines 1403 for transferring a plurality of data signals D0–DN, and a plurality of control lines 1405 for receiving a plurality of control signals. An example of the control signals include row access strobe (RAS*), column access strobe (CAS*), write enable (WE*), and clock (CLK). In some embodiments, the address, data, and control lines 1401, 1403, and 1405 represent external pins of memory device 1400.

Memory device 1400 further includes a plurality of memory cells 1402 for storing data. Memory cells 1402 connect to an address path 1404, a data path 1406, and a control path 1408. Address path 1404 includes an input buffer 1412, a latch 1414, and a decoder 1416. Data path 1406 includes an input buffer 1422, a latch 1424, an output buffer 1423, and a data read/write circuit 1426. Control path 1408 includes an input buffer 1432, a latch 1434, and a control circuit 1436. Address path 1404 connects to address lines 1401 to operate on one of the address signals A0–AX. Data path 1406 connects to data lines 1403 to operate on one of the data signals D0–DN. Control path 1408 connects to control lines 1405 to operate on one of the control signals RAS*, CAS*, WE*, and CLK.

Memory device 1400 further includes other address paths, data paths, and control paths that are similar to address path 1404, data path 1406, and control path 1408. The other address, data, and control paths also connect to address, data, and control lines 1401, 1403, and 1405 in similar fashions as address path 1404, data path 1406, and control path 1408. However, for simplicity, FIG. 14 only shows one of each of the address, data, and control paths.

Memory device 1400 further includes a reference line 1440 to provide a reference signal Vref. In some embodiments, the Vref signal is provided to line 1440 by a circuit or a device that is external to memory device 1400. In other embodiments, the Vref signal is provided to line 1440 by an internal circuit of memory device 1400. In embodiments represented by FIG. 14, the input buffer from each of the address, data, and control paths connects to line 1440 to receive the Vref signal.

Input buffers 1412, 1422, and 1432 can include any one of the amplifying circuits in this specification. When one of the amplifying circuits is used as one of the input buffers, output nodes 316 and 318 of the amplifying circuit (FIG. 3A or others) represent reference line 1440 and one of the address, data, or control lines. For example, when amplifying circuit 300 is used as input buffer 1412, node 306 represents one of the address lines 1401, and node 308 represents reference line 1440. In this case, the INA signal of amplifying circuit 300 represents one of the address signals A0–AX, and the INB signal of amplifying circuit 300 represents the Vref signal.

Each of the input buffers on the address, data, and control path receives the Vref signal and a corresponding signal from the address, data, and control paths. The input buffers operate on the address, data, and control signals and the Vref signal to provide latches 1414, 1424, and 1434 signals representing logic levels of the address, data, and control signals. Based on the signals at the latches, the address, data, and control paths perform appropriate functions to access memory cells 1402. Since the input buffers in memory device 1400 can include any one of the amplifying circuits of the specification, the input buffers have a compensation unit to reduce the effect of the common mode noise on the output of the input buffers. Thus, the overall operation of memory device 1400 is improved.

The overall operation of memory device 1400 is similar to the operation of a typical memory device. Therefore, the operation of memory device 1400 is not described in detail in the specification. Decode circuit 1416 decodes the logic levels of the address signals A0–AX at latch 1414 to identify a location of a selected memory cell, so that data can be read from or written into the selected memory cell. In some embodiments, decode circuit 1416 includes a row decoder and a column decoder to decode a row address and a column address of the memory cell. Control circuit 1436 decodes the logic levels of the control signals RAS*, CAS*, and WE* at latch 1434 to determine whether a read or a write operation will be performed. Read/write circuit 1426 reads data from a selected memory cell during a read operation, and writes data into a selected memory cell represented by the D0–DN signals at latch 1424 during a write operation.

Memory device 1400 can be a dynamic random access memory (DRAM) or other types of memory circuits such as SRAM (Static Random Access Memory) or Flash memories. Furthermore, the DRAM could be a synchronous DRAM commonly referred to as SDRAM (Synchronous Dynamic Random Access Memory), DDR SDRAM (Double Data Rate SDRAM), DDRII SDRAM, or SGRAM (Synchronous Graphics Random Access Memory), and RLDRAM (Reduced Latency DRAM), -RLDRAMII, or Rambus DRAMs. Those of ordinary skill in the art will recognize that memory device 1400 is simplified to illustrate a memory device according to an embodiment of the present invention. Therefore, memory device 1400 is not intended to be a detailed description of all of the features of a memory device.

Figure 15:
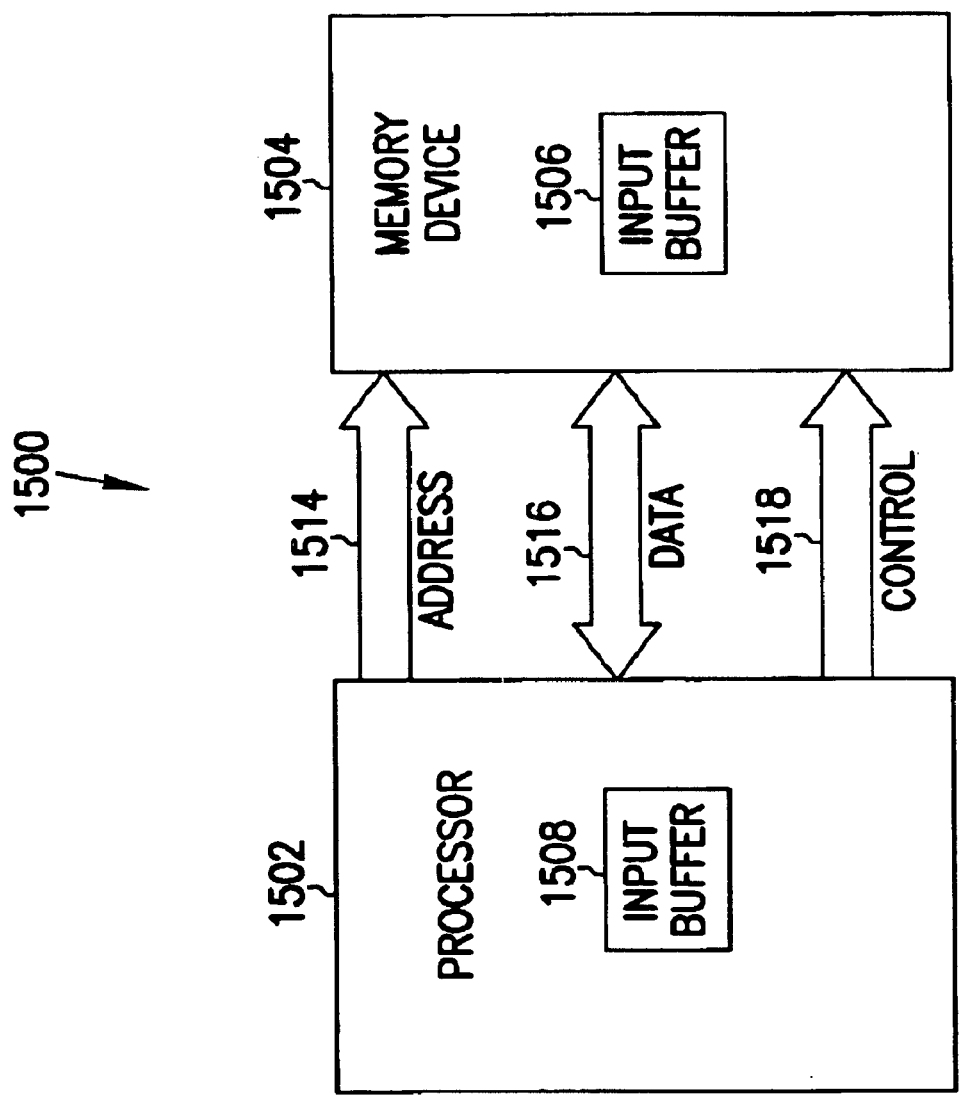
FIG. 15 shows a system according to an embodiment of the invention.

FIG. 15 shows a system according to an embodiment of the invention. System 1500 includes a first integrated circuit (IC) 1502 and a second IC 1504. ICs 1502 and 1504 can include processors, controllers, memory devices, application specific integrated circuits, and other types of integrated circuits. In embodiments represented by FIG. 15, for example, IC 1502 is represented by a processor, and IC 1504 is represented by a memory device. Processor 1502 and memory device 1504 communicate using address signals on lines 1514, data signals on lines 1516, and control signals on lines 1518.

Memory device 1504 can also be memory device 1400 of FIG. 15. Therefore, memory device 1504 includes many circuit elements, and address, data, and control paths such as address, data, and control paths 1404, 1406, and 1408 of memory device 1400. As shown in FIG. 15, memory device 1504 includes at least one input buffer in each of the address, data, and control paths. For simplicity, memory device 1504 shows only one input buffer 1506. In addition, processor 1502 also includes an input buffer 1508 to receive differential signals such as the INA and INB signals described in the specification. Input buffer 1506 or 1508 can include any one of the amplifying circuits in this specification. The operation of memory device 1504 is similar to the operation of memory device 1400.

System 1500 represented by FIG. 15 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Conclusion

Various embodiments of the invention describe circuits and methods to reduce the effect of the common mode noise in differential amplifier circuits. Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A circuit comprising:
    a differential amplifier having a first differential input node and a second differential input node for receiving differential input signals, and having a first differential output node and a second differential output node for outputting differential output signals, wherein the differential amplifier includes a first driver transistor connected to the first differential input node and the first differential output node, a second driver transistor connected to the second differential input node and the second differential output node, a source transistor connected between a second supply node and the first and second driver transistors, and at least one load transistor connected to one of the first and second differential output nodes and a compensation node;

an isolation unit connected in series with a supply path of the differential amplifier between a supply node and the compensation node; and a capacitive network connected to the compensation node and the first and second differential input nodes for compensating a common mode noise affected on the differential output signals.

2. The circuit of claim 1, wherein the capacitive network includes:

a first capacitive element connected between the first differential input node and the compensation node; and a second capacitive element connected between the second differential input node and the compensation node.

3. The circuit of claim 2, wherein each of the first and second capacitive elements is a capacitor.

4. The circuit of claim 3, wherein the isolation unit includes a resistor connected between the supply node and the compensation node.

5. The circuit of claim 3, wherein the isolation unit includes a transistor connected between the supply node and the compensation node.

6. A circuit comprising:

a pair of driver transistors connected to a first differential input node and a second differential input node for receiving differential input signals;

a load unit connected to the pair of driver transistors at a first differential output node and at a second differential output node for outputting differential output signals and to a compensation node;

a current source connected in series with the pair of driver transistors and a supply node;

an isolation unit connected in series with the load unit on a supply path between a second supply node and the compensation node; and a capacitive network connected to the compensation node and to the first and second differential input nodes.

7. The circuit of claim 6, wherein the capacitive network includes:

a first capacitive element connected between the first differential input node and the compensation node; and a second capacitive element connected between the second differential input node and the compensation node.

8. The circuit of claim 7, wherein each of the first and second capacitive elements is a capacitor.

9. The circuit of claim 8, wherein the isolation unit includes a resistor connected between the supply node and the compensation node.

10. The circuit of claim 8, wherein the isolation unit includes a transistor connected between the supply node and the compensation node.

11. The circuit of claim 6, wherein the load unit includes at least one transistor connected between the compensation node and each of the first and second differential output nodes.

12. The circuit of claim 6, wherein the load unit includes a resistor connected between the compensation node and each of the first and second differential output nodes.

13. A circuit comprising:

a first branch and a second branch, each of first and second branches being connected between a supply node and a common node, each of first and second branches including:

a resistive element connected between the supply node and a compensation node;

a load transistor connected between the compensation node and an output node;

a driver transistor connected between the output node and the common node and having a gate connected to an input node to receive an input signal;

a capacitive element connected between the compensation node and the input node; and a current source connected between the common node and a second supply node.

14. The circuit of claim 13, wherein the resistive element is a resistor.

15. The circuit of claim 13, wherein the capacitive element is a capacitor.

16. The circuit of claim 13, wherein the first and second branches are symmetrical.

17. A circuit comprising:

a pair of driver transistors connected to a first differential input node and a second differential input node for receiving differential input signals;

a load unit connected to the pair of driver transistors at a first differential output node and at a second differential output node for outputting differential output signals and to a compensation node;

a current source connected in series with the pair of driver transistors and a supply node;

an isolation unit connected in series with the load unit on a supply path between a second supply node and the compensation node;

a capacitive network connected to the compensation node and the first and second differential input nodes; and a control unit connected between the load unit and the first and second differential output nodes.

18. The circuit of claim 17, wherein the control unit includes:

a first resistive element connected between the load unit and the first differential output node; and a second resistive element connected between the load unit and the second differential output node.

19. The circuit of claim 17, wherein a control unit includes a first control transistor and a second control transistor forming a differential pair, the first control transistor having a gate connected to the first and second differential output nodes through a resistive network, the second control transistor having a gate connected to an input node of the differential pair to receive a reference signal, the differential pair being connected to the load unit at a drain of one of the first and second control transistors.

20. The circuit of claim 19, wherein the resistive network including:

a first resistive element connected between the first differential output node and the a gate of first control transistor; and a second resistive element connected between the second differential output node and the gate of the second control transistor.

21. A circuit comprising:

a differential amplifier having a first differential input node and a second differential input node for receiving differential input signals, and having a first differential output node and a second differential output node for outputting differential output signals, wherein the differential amplifier includes a first driver transistor connected to the first differential input node and the first differential output node, a second driver transistor connected to the second differential input node and the second differential output node, a source transistor connected between a second supply node and the first and second driver transistors, and at least one load transistor connected to one of the first and second differential output nodes and a compensation node;

a capacitive network connected to the differential amplifier for reducing a common mode noise affected on the differential output signals; and a non-differential element connected to one of the first and second differential output nodes to receive one of the differential output signals.

22. The circuit of claim 21, wherein the capacitive network includes:

a first capacitive element connected between the first differential input node and the compensation node of the differential amplifier; and a second capacitive element connected between the second differential input node and the compensation node.

23. The circuit of claim 22, wherein one of the first and second capacitive elements is a capacitor.

24. The circuit of claim 21 further includes an isolation unit connected in series with a supply path of the differential amplifier between a supply node and the compensation node.

25. The circuit of claim 24, wherein the isolation unit includes a resistor connected between the supply node and the compensation node.

26. A memory device comprising:

a plurality of memory cells; and an address path, a data path, and a control path, all paths connected to the memory cells, wherein at least one of the paths includes an input buffer, the input buffer including:

a differential amplifier having a first differential input node and a second amplifier input node for receiving differential input signals, and having a first differential output node and a second differential output node for outputting differential output signals, wherein the differential amplifier includes a first driver transistor connected to the first differential input node and the first differential output node, a second driver transistor connected to the second differential input node and the second differential output node, a source transistor connected between a second supply node and the first and second driver transistors, and at least one load transistor connected to one of the first and second differential output nodes and a compensation node;

an isolation unit connected in series with a supply path of the differential amplifier between a supply node and the compensation node; and a capacitive network connected to the compensation node and to the first and second differential input nodes for compensating a common mode noise affected on the differential output signals.

27. The memory device of claim 26, wherein the capacitive network includes:

a first capacitive element connected between the first differential input node and the compensation node; and a second capacitive element connected between the second differential input node and the compensation node.

28. The memory device of claim 27, wherein each of the first and second capacitive elements is a capacitor.

29. The memory device of claim 28, wherein the isolation unit includes a resistor connected between the supply node and the compensation node.

30. The memory device of claim 28, wherein the isolation unit includes a transistor connected between the supply node and the compensation node.

31. A system comprising:

a processor; and a memory device connected to the processor, the memory device including:

a plurality of memory cells; and an address path, a data path, and a control path, all paths connected to the memory cells, wherein at least one of the paths includes an input buffer, the input buffer including:

a differential amplifier having a first differential input node and a second amplifier input node for receiving differential input signals, and having a first differential output node and a second differential output node for outputting differential output signals, wherein the differential amplifier includes a first driver transistor connected to the first differential input node and the first differential output node, a second driver transistor connected to the second differential input node and the second differential output node, a source transistor connected between a second supply node and the first and second driver transistors, and at least one load transistor connected to one of the first and second differential output nodes and a compensation node;

an isolation unit connected in series with a supply path of the differential amplifier between a supply node and the compensation node; and a capacitive network connected to the compensation node and to the first and second differential input nodes for compensating a common mode noise affected on the differential output signals.

32. The system of claim 31, wherein the capacitive network includes:

a first capacitive element connected between the first differential input node and the compensation node; and a second capacitive element connected between the second differential input node and the compensation node.

33. The system of claim 32, wherein each of the first and second capacitive elements is a capacitor.

34. The system of claim 33, wherein the isolation unit includes a resistor connected between the supply node and the compensation node.

35. The system of claim 33, wherein the isolation unit includes a transistor connected between the supply node and the compensation node.

36. A method comprising:

receiving differential input signals at plurality of input nodes of a differential amplifier;

generating differential output signals at a plurality of output nodes of the differential amplifier, the differential amplifier having a first driver transistor connected to a first output node of the plurality of output nodes and a first input node of the plurality of input nodes, a second driver transistor connected to a second output node of the plurality of output nodes and a second input node of plurality of input nodes, a source transistor connected between a second supply node and the first and second driver transistors, and at least one load transistor connected to one of the first and second output nodes; and compensating a common mode noise affected on the differential output signals using a network with a feed forward path connected to at least one of the input nodes.

37. The method of claim 36, wherein compensating includes connecting a capacitive network to the input nodes of the differential amplifier.

38. The method of claim 37, wherein compensating includes adding a resistive load between a compensation node and a supply node of the differential amplifier.

39. The method of claim 36, wherein compensating includes introducing a capacitance between a compensation node of the differential amplifier and each of the input nodes of the differential amplifier.

40. The method of claim 39, wherein compensating further includes adding a resistance between the compensation node and a supply node of the differential amplifier.

41. A method comprising:

receiving a first input signal and a second signal at a pair of input nodes of a differential amplifier;

generating a first output signal at a first output node of the differential amplifier;

generating a second output signal at a second output node of the differential amplifier, the differential amplifier having a first driver transistor connected to the first output node and a first input node of the pair of input nodes, a second driver transistor connected to the second output node and a second input node of the pair of input nodes, a source transistor connected between a second supply node and the first and second driver transistors, and at least one load transistor connected to one of the first and second output nodes; and compensating a common mode noise affected on the first output signal and the second output signal using a network with a feed forward path connected to at least one input node of the pair of input nodes.

42. The method of claim 41, wherein compensating includes applying a capacitive network to the pair of input nodes of the differential amplifier.

43. The method of claim 42, wherein compensating includes applying a resistance between a compensation node and a supply node of the differential amplifier.

44. The method of claim 43, wherein generating a first output signal and generating a second output signal includes driving a non-differential element using one of the first and second output signals.

45. The method of claim 41, wherein compensating includes introducing a capacitance between a compensation node of the differential amplifier and each input node of the pair of input nodes of the differential amplifier.

46. The method of claim 45, wherein compensating further includes introducing a resistance between the compensation node and a supply node of the differential amplifier.

47. The method of claim 46, wherein generating a first output signal and generating a second output signal includes driving a non-differential element using one of the first and second output signals.

* * * * *